(12) United States Patent
Wei et al.

(10) Patent No.: US 11,951,540 B2
(45) Date of Patent: Apr. 9, 2024

(54) SUPERGRAVITY DIRECTIONAL SOLIDIFICATION MELTING FURNACE EQUIPMENT

(71) Applicant: ZHEJIANG UNIVERSITY, Zhejiang (CN)

(72) Inventors: Hua Wei, Zhejiang (CN); Yadan Xie, Zhejiang (CN); Jianjiang Zhao, Zhejiang (CN); Weian Lin, Zhejiang (CN); Ze Zhang, Zhejiang (CN); Yunmin Chen, Zhejiang (CN)

(73) Assignee: ZHEJIANG UNIVERSITY, Zhejiang (CN)

( * ) Notice: Subject to any disclaimer, the term of this patent is extended or adjusted under 35 U.S.C. 154(b) by 213 days.

(21) Appl. No.: 17/606,455

(22) PCT Filed: Feb. 27, 2020

(86) PCT No.: PCT/CN2020/076971
§ 371 (c)(1),
(2) Date: Oct. 26, 2021

(87) PCT Pub. No.: WO2021/047148
PCT Pub. Date: Mar. 18, 2021

(65) Prior Publication Data
US 2022/0193762 A1    Jun. 23, 2022

(30) Foreign Application Priority Data

Sep. 10, 2019 (CN) .................... 201910853023.X

(51) Int. Cl.
*B22D 27/04* (2006.01)
*B22D 46/00* (2006.01)
*H05B 3/03* (2006.01)

(52) U.S. Cl.
CPC ........... *B22D 27/045* (2013.01); *B22D 46/00* (2013.01); *H05B 3/03* (2013.01)

(58) Field of Classification Search
CPC ......... B22D 27/045; B22D 46/00; H05B 3/03
See application file for complete search history.

(56) References Cited

FOREIGN PATENT DOCUMENTS

| CN | 109358087 | 2/2019 |
|---|---|---|
| CN | 110605146 | 12/2019 |

(Continued)

OTHER PUBLICATIONS

"International Search Report (Form PCT/ISA/210)" of PCT/CN2020/076971, with English translation thereof, dated Jun. 16, 2020, pp. 1-4.

*Primary Examiner* — Kevin P Kerns
*Assistant Examiner* — Steven S Ha
(74) *Attorney, Agent, or Firm* — JCIP GLOBAL INC.

(57) ABSTRACT

Provided is a supergravity directional solidification melting furnace equipment, including a supergravity test chamber and, mounted in the supergravity test chamber, a high-temperature heating subsystem, a crucible, and an air-cooling system. The supergravity test chamber is mounted with a wiring electrode and a cooling air valve device. The high-temperature heating subsystem is fixed in the supergravity test chamber. The crucible and the air cooling system are provided in the high-temperature heating subsystem. The high-temperature heating subsystem includes upper, middle, and lower furnaces, a mullite insulating layer, upper and lower heating cavity outer bodies, upper and lower heating furnace pipes, and a crucible support base. A high-temperature heating cavity is divided into upper and lower parts, is provided therein with a spiral groove, and is fitted with a heating element. The crucible support base is provided therein with a vent pipe channel into which a cooling air is (Continued)

introduced. The crucible and the air cooling system include air inlet and exhaust pipes, a cooling base, a cooling rate adjustment ring, the crucible, and an exhaust cover.

10 Claims, 17 Drawing Sheets

(56) References Cited

FOREIGN PATENT DOCUMENTS

| | | |
|---|---|---|
| CN | 110614355 | 12/2019 |
| CN | 110788302 | 2/2020 |
| EP | 2556907 | 2/2013 |

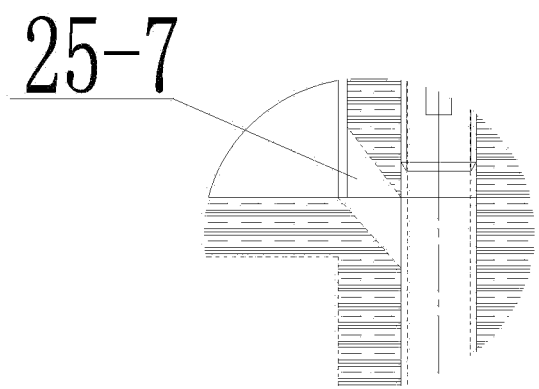
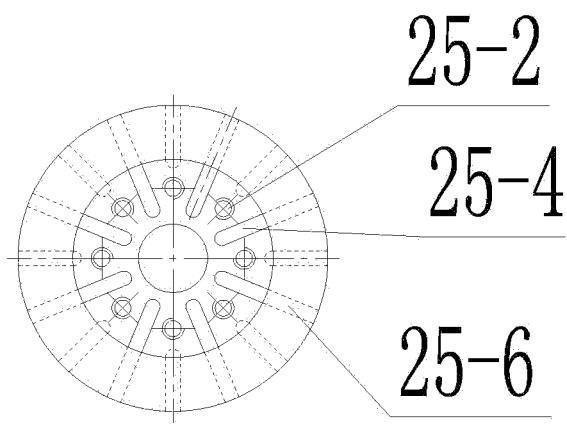
FIG. 12
FIG. 13
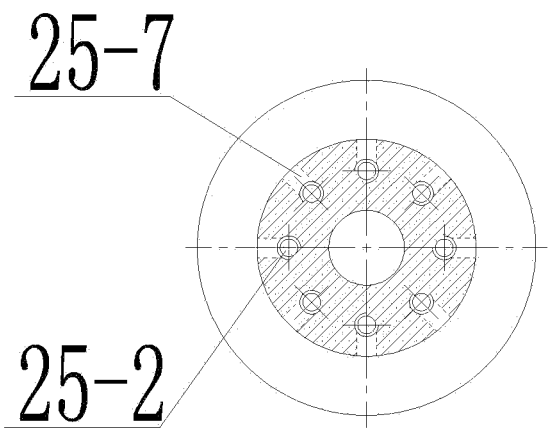
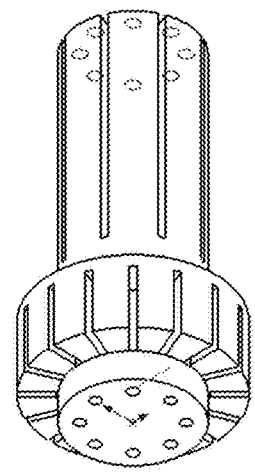
FIG. 14
FIG. 15

SUPERGRAVITY DIRECTIONAL SOLIDIFICATION MELTING FURNACE EQUIPMENT

CROSS-REFERENCE TO RELATED APPLICATION

This application is a 371 of international application of PCT application serial no. PCT/CN2020/076971, filed on Feb. 27, 2020, which claims the priority benefit of China application no. 201910853023.X, filed on Sep. 10, 2019. The entirety of each of the above mentioned patent applications is hereby incorporated by reference herein and made a part of this specification.

BACKGROUND

Field of the Disclosure

The disclosure relates to a supergravity material test device in the technical field of material preparation and directional solidification, and in particular to a supergravity directional solidification melting furnace equipment.

Description of Related Art

With the increase in the thrust-to-weight ratio of engines of modern aircrafts and the decrease in the number of turbine stages, the temperature of front air inlet of turbine has developed from 1400-1500K in the 1970s to 1600-1750K at the beginning of this century. For the engine with the thrust-to-weight ratio of 12-15, the temperature of front air inlet of turbine will reach as high as 2000-2200K, which puts forward higher performance requirements for the core heat end components of the engine. As one of the key components of the heat end components, the high-pressure turbine blades have long been operated under coupled loading conditions such as high temperature, high pressure, high speed, and alternating load.

As one of the key components of the heat end parts of engines of aircrafts and air turbines, the high-pressure turbine blade is the rotating part which is operated under the harshest working condition, and the reliability of high-pressure turbine blade directly affects the overall performance. In the development process of superalloys, technology has played a great role in promoting the development of superalloys. Generally, in order to improve the comprehensive mechanical properties of superalloys, two approaches are adopted: one is to add a large amount of alloying elements, and make solid solution strengthening, precipitation strengthening and grain boundary strengthening through a reasonable heat treatment process, so as to ensure that the superalloy has good strength, indicating stability and good plasticity from room temperature to high temperature; the other one is to adopt the solidification process, through the use of the directional solidification process, grain boundaries are prepared to parallel to the principal stress axis so as to eliminate columnar superalloys that are harmful to lateral grain boundaries, or single crystal superalloys are prepared to eliminate all grain boundaries.

Since orientation and single crystal blades eliminate the lateral grain boundary or completely eliminate the grain boundary, the crystal grows along the specific direction, increasing the initial melting temperature and solution treatment window temperature, increasing the number of γ and making it more refined, greatly improving performance and improving operation temperature. Currently, almost all advanced engines of aircrafts adopt single crystal superalloys. The rapid solidification method is widely used in industry to prepare single crystal alloys, and the prepared single crystal alloy has a temperature gradient of only about 100 K/cm and a very low solidification rate, which leads to coarse solidification structure and serious segregation, and therefore the performance of the material not fully utilized. For the crystals which grow under microgravity, due to the reduction of gravitational acceleration, it is possible to effectively suppress the irregular heat and mass convection caused by gravity. As a result, crystals with highly uniform solute distribution can be obtained. However, the cost of such method is high, making it difficult to be industrialized.

Single crystal alloys can be prepared in a supergravity environment, but there is a lack of temperature gradient control system for realizing directional solidification in a supergravity environment, and there is a lack of furnace system for realizing directional solidification melting in a supergravity environment.

SUMMARY OF THE DISCLOSURE

The disclosure intends to solve the problem that materials are difficult to directionally solidify and melt under high-gravity and high-temperature test conditions. In the disclosure, a material directional solidification melting furnace that is easy to assemble, easy to use, has high safety coefficient, and operates under a high-speed-high-temperature coupling environment can realize directional temperature gradient solidification under high gravity conditions, which makes it possible to prepare single crystal alloys under high gravity.

The test process of the device under high gravity must meet the requirements of high temperature resistance, special atmosphere environment, high G value, cooling air temperature, etc., which is the key technology to ensure the safe and stable operation of the device.

To achieve the above requirements and purpose in the future, the disclosure adopts the technical solutions as follows.

The directional solidification melting system of the disclosure includes a supergravity test chamber, as well as a high-temperature heating subsystem, a crucible, and an air-cooling system mounted in the supergravity test chamber. The high-temperature heating subsystem is fixed at the bottom of the supergravity test chamber. The crucible and the air-cooling system are provided in the high-temperature heating subsystem.

The supergravity test chamber includes a chamber interface member, an upper sealed dome, a chamber lifting lug and a chamber body. The chamber body has a cavity disposed therein. The upper end of the cavity is open. The side walls of the chamber body are connected outwardly with the chamber lifting lug, and the chamber lifting lugs on both sides are hingedly connected to the swing arm of the hanging basket of the supergravity centrifuge. The upper sealed dome is connected to the cavity opening end surface of the chamber body through a bolt to achieve sealed connection. The center of the upper sealed dome is provided with a chamber interface member, and the chamber interface member includes a communication upper sealed hatch cover and a communication chamber body. The communication upper sealed hatch cover is provided at the upper opening of the communication chamber body. Both the communication upper sealed hatch cover and the communication chamber body are provided with an outer flange. The first screw hole is opened on the step surface of the outer flange. The bolt passes through the first screw hole to connect to the upper sealed dome. The chamber interface member is also provided with an upper glass press-fitting flange, an upper flange fastening screw, a quartz glass and a vacuum socket. The quartz glass is fixedly arranged at the opening in the center of the top of the communication upper sealed hatch cover through the upper glass press-fitting flange. The upper glass press-fitting flange is fixed to the top of the upper sealed hatch cover through the upper flange fastening screws. The communication upper sealed hatch cover, the bottom of the communication chamber body is opened with a hole, and the hole is provided with a vacuum socket. The inner bottom surface of the cavity of the chamber body is fixed with a wiring frame and an air supply bracket. One side wall of the chamber body is provided with a wiring hole and a first mounting hole. The other side wall of the chamber body is provided with a wiring hole and a second mounting hole symmetrically. The wiring hole is provided with a wiring electrode. The wiring electrode is connected to the wiring frame inside the chamber body through the wiring hole, and the weak signal control wire is connected to the wiring frame through the first mounting hole. The cooling air valve device is arranged in the second mounting hole. The cooling air is connected to the cooling air valve device through the pipeline. The cooling air valve device enters and exits the air ports for communication through the pipeline on the air supply bracket and the test instrument in the chamber body.

The high-temperature heating subsystem includes a mounting base and an upper furnace, a middle furnace, a lower furnace and a mullite insulating layer arranged on the mounting base and connected in sequence from top to bottom, an upper heating cavity outer body, a lower heating cavity outer body, an upper heating furnace pipe, a lower heating furnace pipe, a crucible support base, and a heating element. The crucible support base is provided at the bottom of the lower cavity insulating layer of the lower furnace. The bottom of the crucible support base is fixed at the mounting base. The heating cavity is arranged on the crucible support base. The heating cavity includes an upper heating cavity outer body, a lower heating cavity outer body, an upper heating furnace pipe, and a lower heating furnace pipe. The upper heating cavity outer body and the lower heating cavity outer body are both sleeve structures. The upper heating cavity outer body and the lower heating cavity outer body are respectively and coaxially fixed for abutment in the upper and lower directions. The upper heating furnace pipe and the lower heating furnace pipe are respectively sleeved in the upper heating cavity outer body and the lower heating cavity outer body. The upper heating cavity outer body and the lower heating cavity outer body are filled with a mullite insulating layer between the upper cavity insulating layer of the upper furnace, the middle cavity insulating layer of the middle furnace, and the lower cavity insulating layer of the lower furnace. A spiral groove is processed on the outer walls of the upper heating furnace pipe and the lower heating furnace pipe. The spiral groove is provided with a spiral heating element. The heat generated by the heating element is evenly radiated to the heating furnace pipe composed of the upper heating furnace pipe and the lower heating furnace pipe, and a high temperature zone is formed at the center of the heating furnace pipe.

The crucible and air-cooling system are placed inside the upper heating furnace pipe and the lower heating furnace pipe on the crucible support base. The crucible and air-cooling system include an air inlet pipe, a cooling base, a cooling rate adjustment ring, a crucible, an exhaust cover and an exhaust pipe. A cooling base is arranged on the top surface of the crucible support base. The crucible is arranged on the cooling base, the exhaust cover is arranged on the top of the crucible, and the cooling rate adjustment ring is arranged in the middle of the crucible. A center cavity, a cooling hole, a temperature gradient adjustment block, a heat radiation groove, a positioning flange block, a heat-dissipating groove, and an air discharge hole are arranged on the crucible. The main body of the crucible is a columnar structure, and the center of the top surface of the crucible is provided with a cylindrical blind hole as the center cavity. The center cavity is filled with the metal melt/metal sample to be solidified by supergravity directional solidification. The top surface of the crucible around the center cavity is provided with multiple vertical through holes as cooling holes along the circumference. The multiple cooling holes are evenly spaced along the circumferential direction. Cooling air passes through the lower end of the cooling hole. Each cooling hole is provided with a temperature gradient adjustment block for realizing and adjusting the temperature gradient for directional solidification. There is a gap between the temperature gradient adjustment block and the wall of the cooling hole. The temperature gradient adjustment block can move up and down in the axial direction in the cooling hole. The ring-shaped bump serves as a positioning flange block is fixed at the lower circumferential surface of the crucible. The outer peripheral cylindrical surface of the lower part of the positioning flange block is provided with multiple heat-dissipating grooves. The heat-dissipating groove extends radially outward from the inner wall of the crucible body to the outer wall of the positioning flange block. The crucible outer peripheral cylinder above the positioning flange block is provided with multiple heat radiation grooves, and multiple heat radiation grooves are evenly spaced along the circumferential direction. A heat radiation groove is provided at the crucible outer peripheral cylinder surface between two adjacent cooling holes. On both sides of the crucible side wall at the top surface of the positioning flange block, through holes are symmetrically opened as air discharge holes, which connect the cooling hole and the outside of the crucible. The upper end of the cooling base is open, and there is a lower annular groove in the opening. The lower end of the crucible is arranged in the upper opening of the cooling base, and the various cooling holes of the crucible are connected through the lower annular groove. The bottom end of the cooling base is provided with an air inlet through hole communicating with the lower annular groove. The cooling rate adjustment ring is fixedly arranged on the positioning flange block of the crucible. The top surface of the cooling rate adjustment ring is provided with one or two vertical air collecting grooves, and the bottom end of the air collecting groove passes through the inner wall of the cooling rate adjustment ring and communicates with the air discharge hole of the crucible. The lower end of the exhaust cover is opened, and the upper annular groove is arranged in the opening. The lower end of the crucible is arranged in the opening at the lower end of the exhaust cover, and the upper end of each cooling hole of the crucible is connected through the upper annular groove. A air outlet through hole communicating with the upper annular groove is opened at the bottom end of the exhaust cover. The air outlet through hole of the exhaust cover communicates with one end of the exhaust pipe; the other end of the exhaust pipe communicates with the outside to discharge the cooling air. The middle of the opening at the lower end of the exhaust cover forms a boss, and the boss is embedded at the top of the center cavity of the crucible.

The crucible support base is provided with a vent pipe channel therein, which is used for introducing the cooling air for directional solidification. The upper end of the vent pipe channel penetrates the top surface of the crucible support base to serve as an outlet and is connected to the air inlet through hole of the cooling base. The lower end of the vent pipe channel penetrates through the outer wall of the bottom of the crucible support base and serves as an inlet, which is connected to one end of the air inlet pipe, and the other end of the air inlet pipe is connected to a cooling air source. The cooling air for the directional solidification test enters through the lower end of the vent pipe channel, and is introduced into the bottom of the crucible through the outlet at the upper end of the vent pipe channel. The cooling air cools the bottom of the crucible, thereby forming a temperature gradient along the direction of supergravity for directional solidification. Moreover, by regulating the flow of introduced cooling air and the temperature generated by the heating element, the temperature gradient distribution along the direction of supergravity is regulated.

During the operation process, the heating element generates heat. The upper heating furnace pipe and the lower heating furnace pipe are heated through radiation to form a high temperature zone in the center of the heating furnace pipe. By changing the intervals of spiral grooves at different heights, the intervals of heating elements at different heights in the heating furnace are changed. With the temperature and flow rate of the cooling air introduced through the vent pipe channel at the crucible support base, the bottom of the crucible starts to be cooled, forming a temperature gradient along the direction of supergravity.

The wiring electrode includes an inner hexagon screw, a copper electrode, an electrode insulating sleeve and an electrode fixing insulating sleeve. The copper electrode has a structure with large and small ends. The center of large end surface of the copper electrode is provided with a connecting screw hole. The large end surface of the copper electrode fixed around the screw hole is opened with a connecting screw hole. The electrode insulating sleeve is sleeved on the small end of the copper electrode as well as the step between the small end and the large end. The inner hexagon screw is connected to the electrode insulating sleeve through the connecting screw hole, so that the copper electrode is fixedly arranged in the electrode insulating sleeve through inner hexagon screws. An electrode fixing insulating sleeve is arranged between the inner hexagon screw and the copper electrode. The end portion of the small end of the copper electrode penetrates through the electrode insulating sleeve and is connected to an external strong power supply. The copper electrode is provided with a ring-shaped sharp protrusion at the step between the small end and the large end.

The cooling air valve device is provided in the supergravity test chamber and includes an inner hexagon screw, a vent valve base, a sealing sleeve and a sealing member. The vent valve base is a structure with a large end and a small end. The center of the large end surface of the vent valve base is provided with an air pipe fixing screw hole, which is connected with the air supply pipe or exhaust pipe outside the supergravity test chamber in a sealed manner. The large end surface of the vent valve base around the air pipe fixing screw hole is opened with the mounting screw hole. The sealing sleeve is sleeved on the small end of the vent valve base and on the step between the small end and the large end. The sealing sleeve is provided with a connecting screw hole corresponding to the mounting screw hole. The inner hexagon screw passes through the mounting screw hole and the connecting screw hole and then is connected to the threaded mounting hole on the side wall of the supergravity test chamber. In this way, the vent valve base and sealing sleeve are arranged on the supergravity test chamber. A sealing member is arranged between the inner hexagon screw and the mounting screw hole of the vent valve base. The small end of the vent valve base penetrates the sealing sleeve and extends into the supergravity test chamber. An air pipe connecting screw hole is opened in the center of the small end surface of the vent valve base inside the supergravity test chamber. The air pipe connecting screw hole and the air pipe fixing screw hole are communicated through the internal passage of the vent valve base. The air pipe connecting screw hole is connected with the air pipe on the air supply bracket inside the supergravity test chamber in a sealed manner.

The vent valve base is the same as the copper electrode, of which the large end is round, and the small end is square. The vent valve base is the same as the copper electrode, for which a ring-shaped sharp protrusion is provided on the step between the small end and the large end. The sharp protrusion is used for positioning the vent valve base, and can also limit the radial/axial movement of the vent valve base under the action of the centrifuge.

The large end of the copper electrode of the wiring electrode is round and the small end is square. The small end surface of the copper electrode is provided with a wiring column, and the wiring column is connected to the wiring terminal of the strong power supply of the supergravity device.

A plurality of spaced fixing holes are opened on the surface of the lug part of the chamber lifting lug protruding radially. The bolts pass through the fixing holes and are connected to the rotating arm of the supergravity centrifuge, so that the chamber lifting lug is connected to the rotating arm of the supergravity centrifuge through the fixing hole and the bolt.

The outer side wall of the chamber body is provided with a vacuum interface, and the vacuum interface is directly connected with the vacuum pipe outside the chamber body.

The supergravity test chamber is also provided with a bearing frame, a signal collector and a wiring frame. The upper heating furnace pipe and the lower heating furnace pipe of the high-temperature heating subsystem are equipped with material samples to be directionally solidified, and provided with a temperature sensor. The temperature sensor is connected to the signal collector, the wire output by the signal collector is connected to the weak signal conductive slip ring through the wiring frame, and then connected to the ground measurement and control center. The high-temperature heating subsystem is provided with a one-way strong current independent circuit. The one-way strong current independent circuit controls to heat the heating elements at different heights inside for high temperature heating. A strong current independent circuit on the ground is connected to the wiring frame of the supergravity test chamber through the conductive slip ring of the centrifuge spindle. The high-temperature heating subsystem is provided with a one-way cooling air circuit. The one-way cooling air independent circuit controls the incoming cooling air flow, and a cooling air independent circuit on the ground is connected to the cooling air pipeline bracket and exhaust pipe of the supergravity test chamber through the conductive slip ring of the centrifuge spindle.

The supergravity test chamber is used for supergravity directional solidification test. Two second mounting holes are provided. Each second mounting hole is provided with a cooling air valve device. One cooling air valve device is used as an air supply device, and the other cooling air valve device is used as an exhaust device. The cooling air is introduced into the air pipe fixing screw hole of the air supply device through the air supply slip ring/air supply pipe through the air source outside the supergravity test chamber. Then, the cooling air enters the lower inlet of the internal vent pipe channel inside the supergravity test chamber through the air pipe connection screw hole of the air supply device, so as to cool the temperature or supply air for the cooling device. The cooling air discharged from the upper outlet of the vent pipe channel inside the supergravity test chamber passes through the air pipe to enter the air pipe connecting screw hole of the exhaust device, and then is discharged from the exhaust slip ring/exhaust pipe that is outside the supergravity test chamber and communicates with the air pipe fixing screw hole of the exhaust device.

The directional solidification melting system is placed in the supergravity environment of the centrifuge.

The disclosure realizes a modular structure design with high strength and light quality. The experiment preparation period is short, and the solidification process is safe and reliable, thereby assuring safety and reliability for the experiment under supergravity.

The disclosure can be used to realize temperature gradient control of directional solidification in a supergravity environment, so that crystal growth can be carried out under supergravity, and buoyancy convection can be strengthened by increasing the acceleration of gravity. When the buoyancy convection is increased to a certain level, it is transformed into a laminar flow state, that is, re-laminar fluidization, which also suppresses irregular heat and mass convection. The forced convection of the liquid phase occurs during the accelerated rotation process, which greatly changes the heat and mass transfer process and causes a significant change in the interface morphology, resulting in a significant reduction in the width of the mushy zone. The rapid flow of the liquid phase causes a great increase in the temperature gradient in the liquid phase in the front of the interface, which significantly expedites the uniform mixing of liquid solutes and the growth of the flat interface of the material. The dendrite growth morphology changes significantly from the original dendrite with obvious main axis to a spike-like crystal with no obvious main axis, and the spike-like crystal has a fine microstructure.

The advantageous effects of the disclosure are as follows.

The disclosure provides a set of directional temperature gradient solidification furnace for the directional solidification device in the supergravity environment, and can perform the temperature gradient control processing process on the material sample that needs to undergo directional solidification and melting in the supergravity environment. The disclosure can realize directional solidification and melting for material under the centrifugal load-thermal load coupling condition, which can effectively solve the problem currently raised in temperature gradient of directional solidification and melting for material under test conditions of high gravity and high temperature. The disclosure has the advantages of simple structure, operation scheme and high safety coefficient.

The disclosure adapts to the supergravity environment, and is able to heat samples subjected to directional solidification melting for materials under the condition of high rotation speed, such as the orientation of high temperature alloy and single crystal growth, thereby solving the key problem of temperature gradient of directional solidification melting for material in the high-speed rotation state, and filling the gap in the technical industry in China. Besides, the equipment of the disclosure is simple and the operation is convenient. The disclosure is suitable for the supergravity environment of 1 g-2000 g, and the heating temperature ranges from normal temperature to −1250° C.

BRIEF DESCRIPTION OF THE DRAWINGS

FIG. 12 is a partial enlarged cross-sectional view of the part marked A in FIG. 11.

FIG. 13 is a top view of the crucible.

FIG. 14 is a cross-sectional view along line A-A in FIG. 11.

FIG. 15 is a perspective view of crucible.

Figure 1:
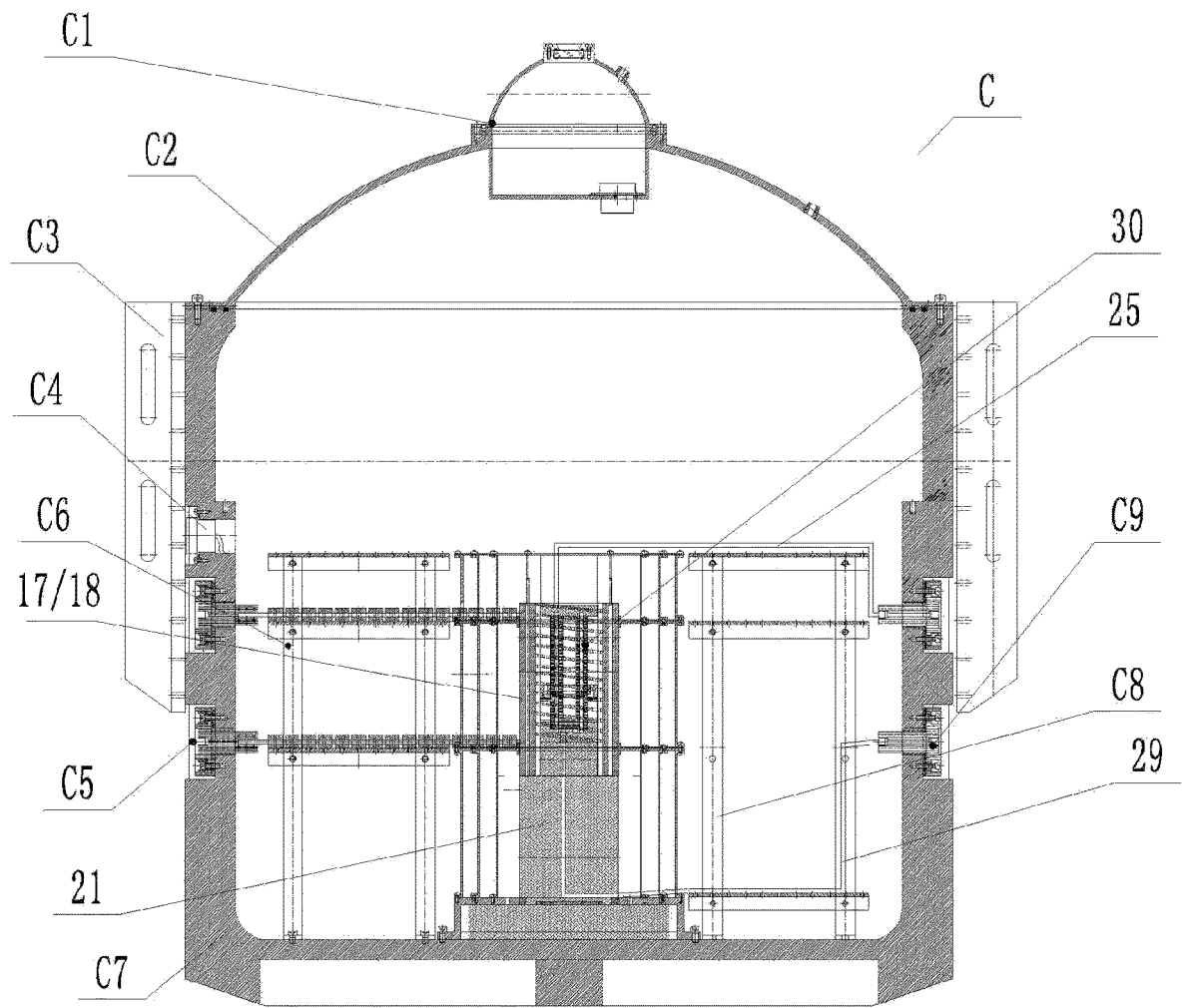
FIG. 1 is a front view of the multifunctional experimental chamber of the on-board supergravity centrifugal simulation device of the disclosure.

In the figure: upper insulating cover 1, upper cavity outer housing 2, upper cavity middle housing 3, upper cavity insulating layer 4, upper cavity lower fixing cover 5, middle insulating cover 6, middle cavity outer housing 7, middle cavity middle housing 8, middle cavity insulating layer 9, middle cavity lower fixing cover 10, lower insulating cover 11, lower cavity outer housing 12, lower cavity middle housing 13, lower cavity insulating layer 14, lower cavity lower fixing cover 15, mullite insulating layer 16, upper heating cavity outer body 17, lower heating cavity outer body 18, upper heating furnace pipe 21, lower heating furnace pipe 20, crucible support base 21, heating element 22, spiral groove 22-1, vent pipe channel 21-1, mounting base 23; crucible 25, center cavity 25-1, cooling hole 25-2, temperature gradient adjustment block 25-3, heat radiation groove 25-4, positioning flange block 25-5, heat-dissipating groove 25-6, air discharge hole 25-7; air inlet pipe 29, crucible support base 21, cooling base 26, cooling rate adjustment ring 27, crucible 25, exhaust cover 28, exhaust pipe 30; vent pipe channel 21-1, air inlet through hole 26-1, lower annular groove 26-2, air collecting slot 27-1, air outlet through hole 28-1, upper annular groove 28-2, boss 28-3;

supergravity test chamber C, chamber interface member C1, upper sealed dome C2, chamber lifting lug C3, vacuum interface C4, wiring electrode C5, wiring frame C6, chamber body C7, air supply bracket C8, cooling air valve device C9, upper glass press-fitting flange C12-1, upper flange fastening screws C12-2, quartz glass C12-3, communication upper sealed hatch cover C12-4, communication chamber body C12-5, vacuum socket C12-6, first screw hole C12-7, wiring hole C7-1, first mounting hole C7-2; inner hexagon screw C51, copper electrode C52, electrode insulating sleeve C53, electrode fixing insulating sleeve C54, fixing screw hole C52-1, connecting screw hole C52-2, wiring column C52-3, mounting screw hole C54-1, inner hexagon screw C91, vent valve base C92, sealing sleeve C93, sealing member C94, fixing screw hole C92-1, air pipe fixing screw hole C92-2, air pipe connecting screw hole C92-3.

DESCRIPTION OF EMBODIMENTS

The disclosure will now be described in further detail with reference to the accompanying drawings. These drawings are simplified schematic diagrams, which only illustrate the basic structure of the disclosure in a schematic manner, and therefore only show the constitutions related to the disclosure.

Figure 4:
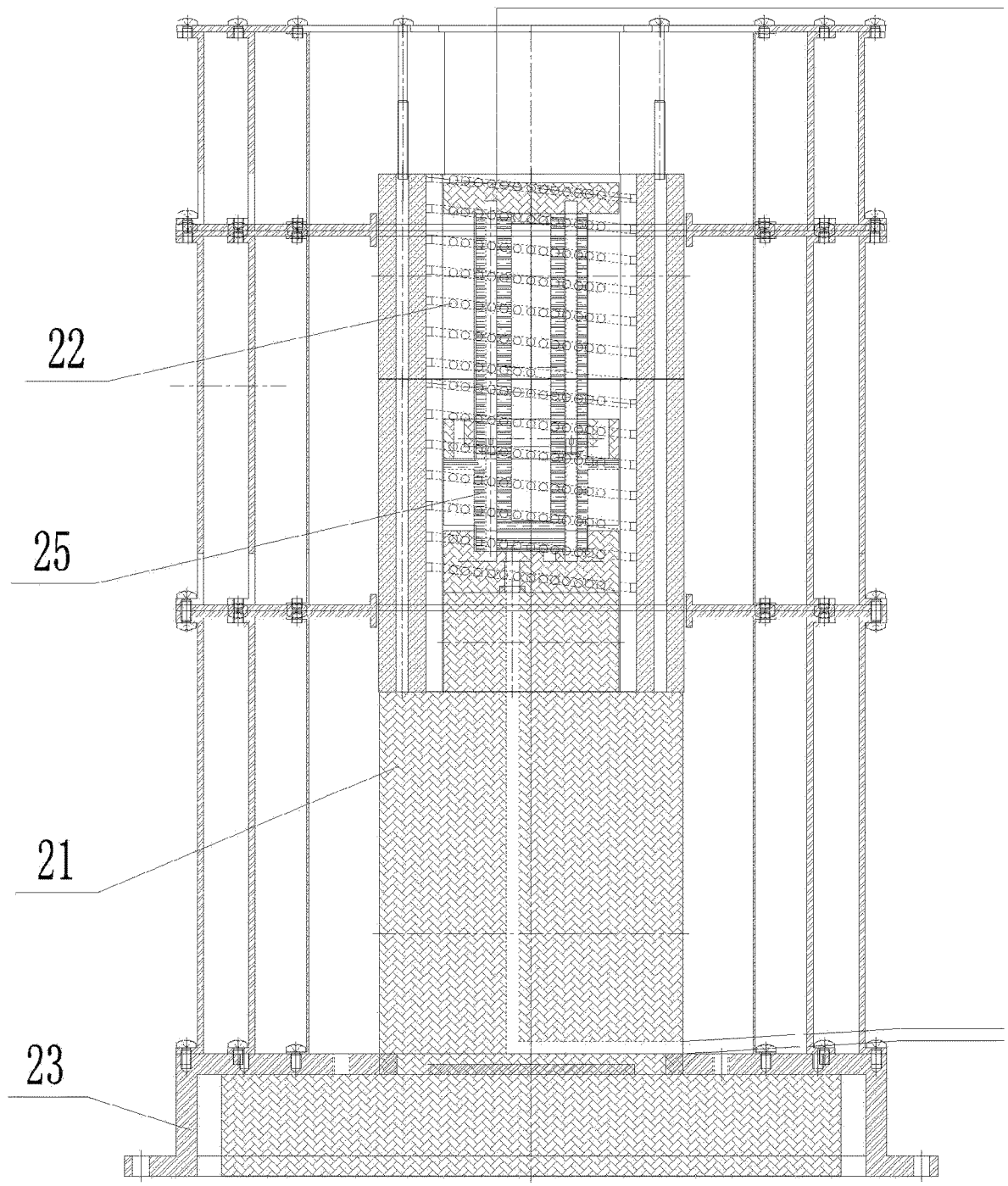
FIG. 4 is a front view of the directional solidification melting system.

As shown in FIG. 1, the directional solidification melting system includes a supergravity test chamber C, as well as a high-temperature heating subsystem, a crucible and an air-cooling system arranged in the supergravity test chamber C. The high-temperature heating subsystem is fixed at the bottom of the supergravity test chamber C, the crucible and the air-cooling system is placed in the high-temperature heating subsystem, as shown in FIG. 4.

As shown in FIG. 1, the supergravity test chamber C includes a chamber interface member C1, an upper sealed dome C2, a chamber lifting lug C3, and a chamber body C7. The chamber body C7 has a cavity therein, and the upper end of the cavity is open. Both side walls of the chamber body C7 are connected outwardly with the chamber lifting lug C3. The chamber lifting lug C3 on both sides is hingedly connected to the swing arm of the supergravity centrifuge, and the upper sealed dome C2 is connected to the cavity opening end surface of the chamber body C7 through bolt configuration in a sealed manner.

Figure 2:
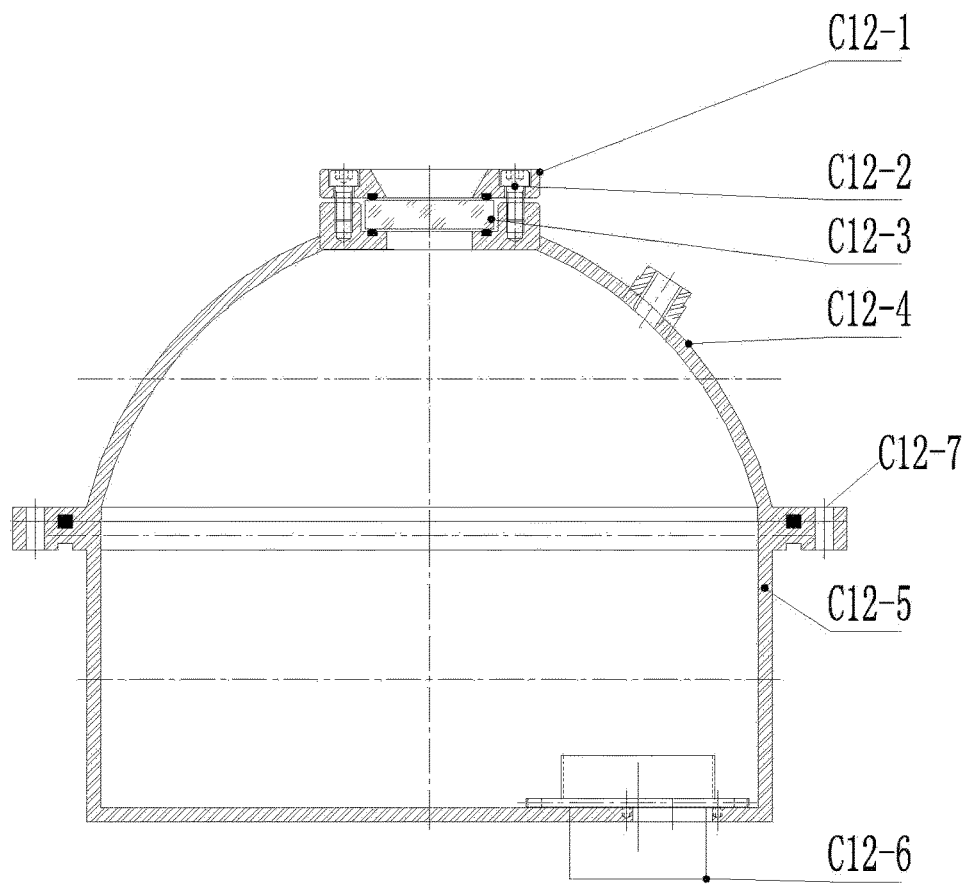
FIG. 2 is a front view of chamber interface member 1; C12-1 upper glass press-fitting flange; C12-2 upper flange fastening screws; C12-3 quartz glass; C12-4 communication upper sealed hatch cover; C12-5 communication chamber body; C12-6 vacuum socket; C12-7 connecting screw hole.

As shown in FIG. 2, the center of the upper sealed dome C2 is provided with the chamber interface member C1, which includes the communication upper sealed hatch cover C12-4 and the communication chamber body C12-5. The communication upper sealed hatch cover C12-4 is arranged at the upper end opening of the communication chamber body C12-5. The communication upper sealed hatch cover C12-4 and communication chamber body C12-5 are provided with outer flanges. The first screw hole C12-7 is opened on the step surface of the outer flange, and bolts pass through the first screw hole C12-7 to be connected to the upper sealed dome C2. The chamber interface member C1 is further provided with the upper glass press-fitting flange C12-1, the upper flange fastening screw C12-2, the quartz glass C12-3 and the vacuum socket C12-6. The quartz glass C12-3 is fixedly arranged at the opening at center of the top of the communication upper sealed hatch cover C12-4 through the upper glass press-fit flange C12-1. The upper glass press-fitting flange C12-1 is fixed to the top of the upper sealed hatch cover C12-4 and the communication upper sealed dome C12-4 through the upper flange fastening screw C12-2. The bottom of the communication chamber body C12-5 is opened with a hole, and the hole is provided with a vacuum socket C12-6.

Figure 3:
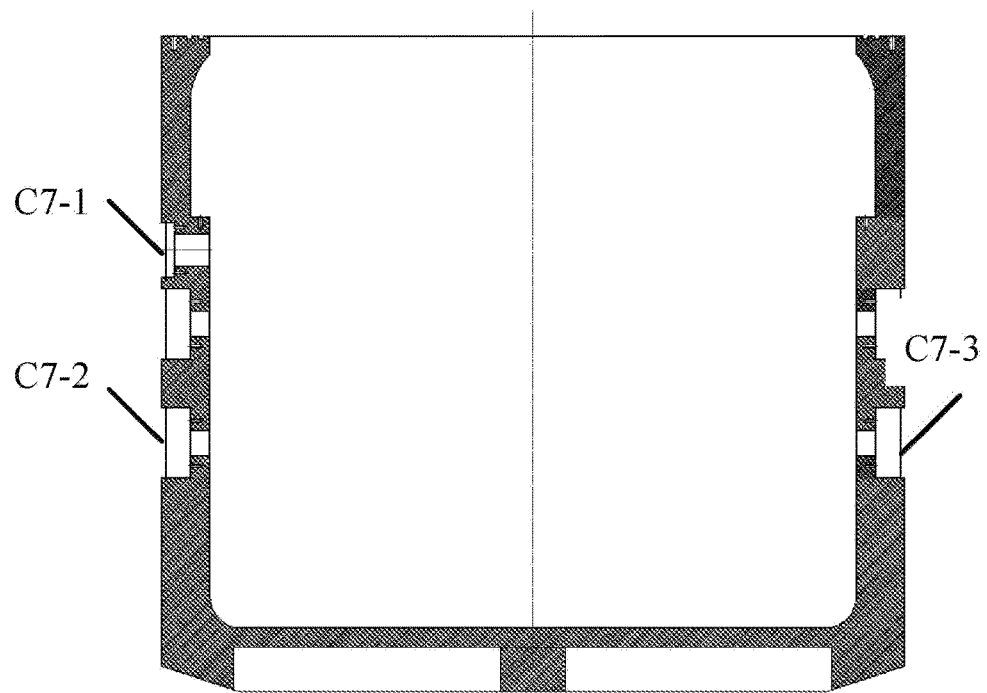
FIG. 3 is a schematic view of chamber body 7; C7-1 wiring hole; C7-2 first mounting hole.

As shown in FIG. 3, the inner bottom surface of the cavity of the chamber body C7 is fixed with a wiring frame C6 and an air supply bracket C8. One side wall of the chamber body C7 is provided with a wiring hole C7-1 and a first mounting hole C7-2. The other side wall of the chamber body C7 is provided with a wiring hole and a second mounting hole C7-3 symmetrically. The wiring hole C7-1 is provided with a wiring electrode C5. The wiring electrode C5 is connected to the wiring frame C6 inside the chamber body C7 through the wiring hole C7-1, and the weak signal control wire is connected to the wiring frame C6 through the first mounting hole C7-2. The cooling air valve device C9 is arranged in the second mounting hole C7-3. The cooling air is connected to the cooling air valve device C9 through the pipeline. The cooling air valve device C9 enters and exits the air ports for communication through the pipeline on the air supply bracket C8 and the test instrument in the chamber body C7.

Figure 5:
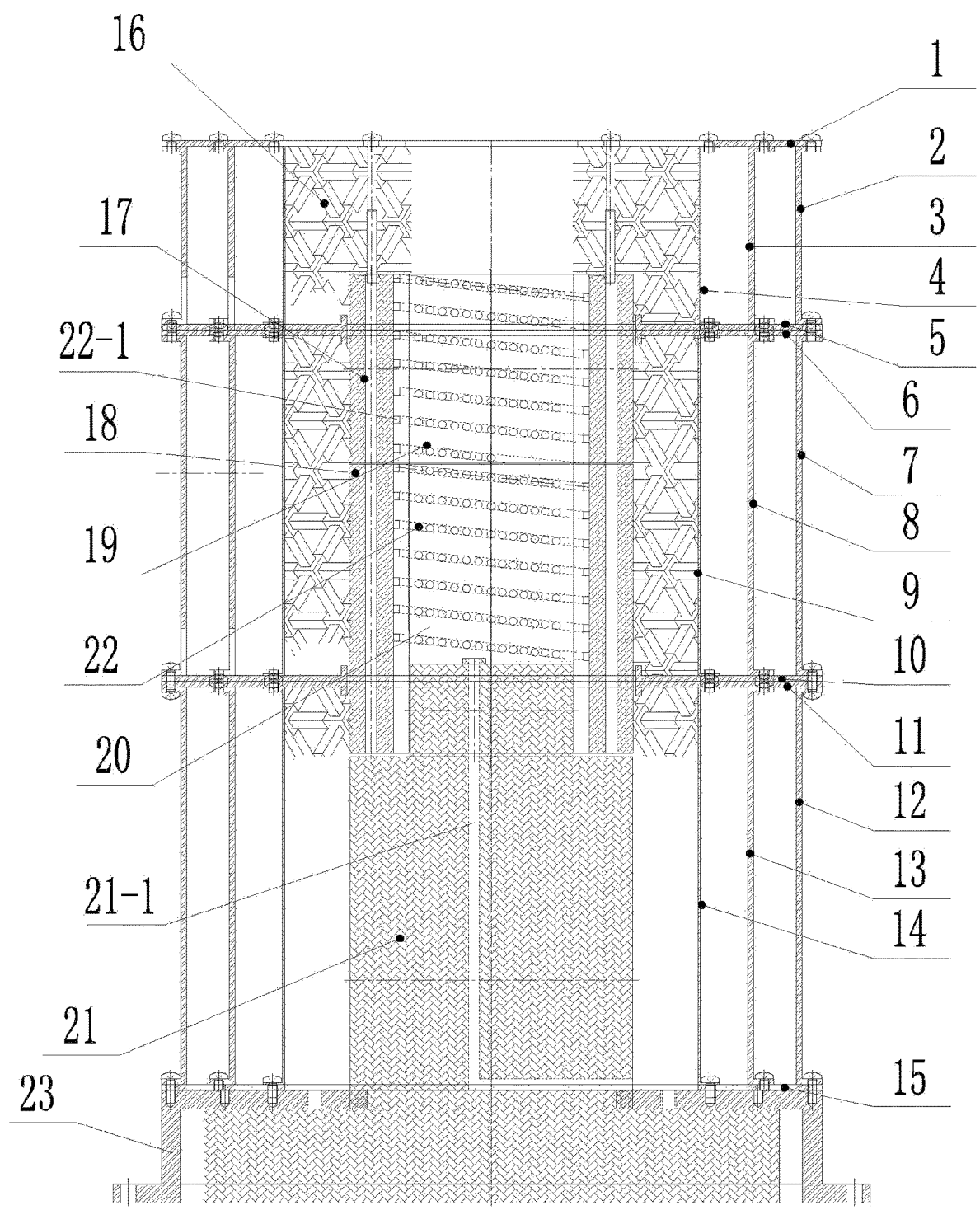
FIG. 5 is a front view of the high-temperature heating subsystem.
Figure 19:
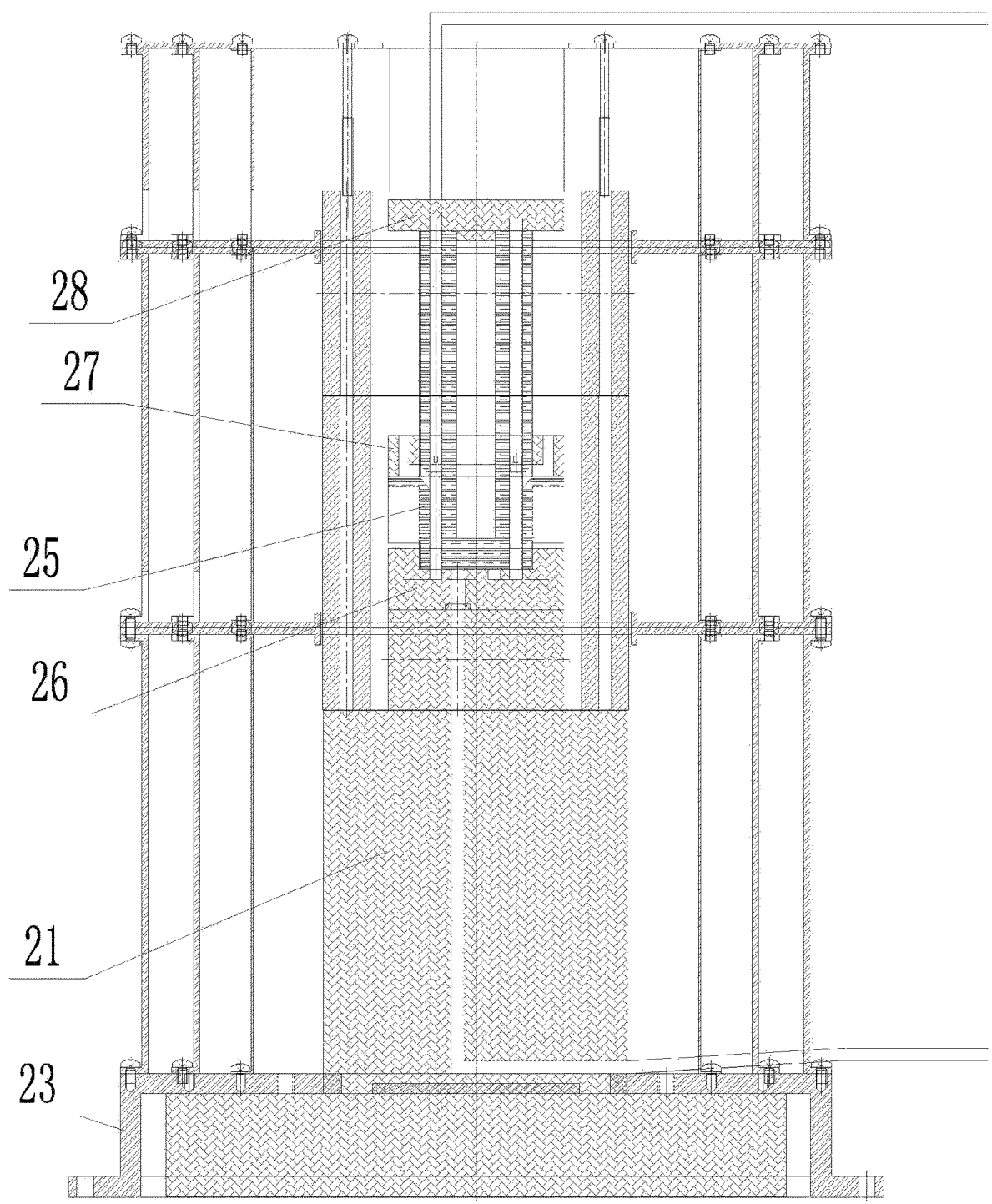
FIG. 19 is a cross-sectional view of the high-temperature heating subsystem.

As shown in FIG. 5 and FIG. 19, the high-temperature heating subsystem includes a mounting base 23 and an upper furnace, a middle furnace, a lower furnace and a mullite insulating layer 16 arranged on the mounting base 23 and connected in sequence from top to bottom, an upper heating cavity outer body 17, a lower heating cavity outer body 18, an upper heating furnace pipe 19, a lower heating furnace pipe 20, a crucible support base 21, and a heating element 22. The upper insulating cover 1, the upper cavity outer housing 2, the upper cavity middle housing 3, the upper cavity insulating layer 4, the upper cavity lower fixing cover 5, the middle insulating cover 6, the middle cavity outer housing 7, the middle cavity middle housing 8, the middle cavity insulating layer 9, the middle cavity lower fixing cover 10, the lower insulating cover 11, the lower cavity outer housing 12, the lower cavity middle housing 13, the lower cavity insulating layer 14, and the lower cavity fixing cover 15 form the outer housing of the cylindrical high-temperature heating subsystem composed of three furnace bodies, which is mainly used to fix the high-temperature heating subsystem in a supergravity environment, and serves the function in protecting the furnace body in a supergravity environment, thereby forming a high-temperature furnace as a whole.

The upper furnace is mainly composed of the upper insulating cover 1, the upper cavity outer housing 2, the upper cavity middle housing 3, the upper cavity insulating layer 4, and the upper cavity lower fixing cover 5. The upper cavity outer housing 2, the upper cavity middle housing 3, and the upper cavity insulating layer 4 from the outside to the inside are arranged to form the three-layer structure of the upper furnace 3. The upper insulating cover 1 and the upper cavity lower fixing cover 5 are respectively arranged on the upper and lower ends of the three-layer structure of the upper furnace, so that the three-layer structure of the upper furnace is fixedly connected. The upper insulating cover 1 is used to fix the upper furnace three-layer structure of the upper furnace and serves the function of thermal insulation. There are gaps between the upper cavity housing 2 and the upper cavity middle housing 3 and between the upper cavity middle housing 3 and the upper cavity insulating layer 4 as the air insulating layer, and the air insulating layer serves the function of thermal insulation to prevent loss of heat in the furnace.

The middle furnace is mainly composed of the middle insulating cover 6, the middle cavity outer housing 7, the middle cavity middle housing 8, the middle cavity insulating layer 9, and the middle cavity lower fixing cover 10. The middle cavity outer housing 7, the middle cavity middle housing 8, and the middle cavity insulating layer 9 from outside to inside are arranged to form a middle furnace three-layer structure. The middle insulating cover 6 and the middle cavity lower fixing cover 10 are respectively arranged at the upper and lower ends of the middle furnace three-layer structure, so that the middle furnace three-layer structure is fixedly connected. The middle insulating cover 6 is used to fix the middle furnace three-layer structure of the middle furnace, and serves the function of thermal insulation. The middle insulating cover 6 serves the function of thermal insulation, preventing heat from being conducted downward under the action of supergravity. There are gaps serving as air insulating layers between the middle cavity outer housing 7 and the middle cavity middle housing 8, and between the middle cavity middle housing 8 and the middle cavity insulating layer 9. The air insulating layer serves the function of thermal insulation to prevent loss of heat in the furnace. The upper cavity lower fixing cover 5 of the upper furnace is fixedly connected with the middle insulating cover 6 of the middle furnace, and the upper cavity lower fixing cover 5 and middle insulating cover 6 are connected to connect the upper furnace and the middle furnace.

The lower furnace is mainly composed of a lower insulating cover 11, a lower cavity outer housing 12, a lower cavity middle housing 13, a lower cavity insulating layer 14, and a lower cavity fixing cover 15. The lower cavity outer housing 12, the lower cavity middle housing 13, and the lower cavity insulating layer 14 from the outside to the inside are arranged to form a lower furnace three-layer structure. The lower insulating cover 11 and lower cavity lower fixing cover 15 are respectively arranged on the upper and lower ends of the lower furnace three-layer structure, so that the lower furnace three-layer structure is fixedly connected. The bottom of the lower cavity lower fixing cover 15 is fixed to the mounting base 23 through bolts and screws, and the mounting base 23 is fixed on the base of the supergravity test chamber of the supergravity centrifuge. The lower insulating cover 11 is used to fix the lower furnace three-layer structure of the lower furnace and has the function of thermal insulation. The lower insulating cover 11 has the function of thermal insulation to prevent heat from being conducted downward under the action of supergravity. The lower cavity lower fixing cover 15 is used to fix the high-temperature heating subsystem at the bottom of the supergravity test device. There are gaps serving as an air insulating layer between the lower cavity outer housing 12 and the lower cavity middle housing 13 and between the lower cavity middle housing 13 and the lower cavity insulating layer 14. The air insulating layer plays a role of thermal insulation to prevent loss of heat in the furnace. The middle cavity lower fixing cover 10 of the middle furnace and the lower insulating cover 11 of the lower furnace are fixedly connected, and the middle cavity lower fixing cover 10 and the lower insulating cover 11 are connected to connect the middle furnace and the lower furnace.

The entire furnace is reinforced by making reinforcement at four spots: the upper insulating cover 1, the upper cavity lower fixing cover 5, the middle insulating cover 6, the middle cavity lower fixing cover 10, the lower insulating cover 11 and the lower cavity lower fixing cover 15, so as to improve the rigidity and strength of the overall furnace in a supergravity environment, thereby preventing deformation and damage of the furnace during operation. The upper cavity lower fixing cover 5 and middle insulating cover 6, the middle cavity lower fixing cover 10 and the lower insulating cover 11 are connected through high-strength bolts, making it convenient for configuration and maintenance.

Figure 6:
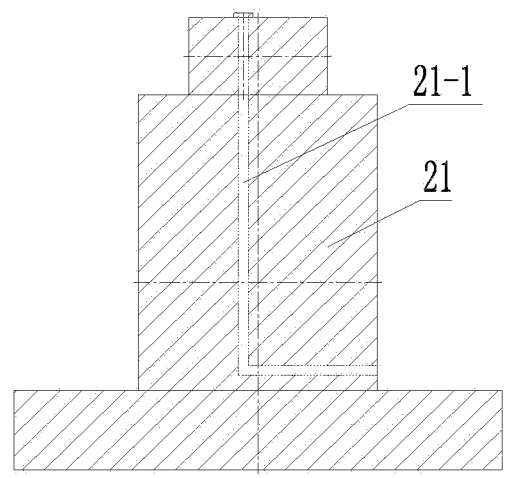
FIG. 6 is a structural cross-sectional view of the crucible support base.
Figure 7:
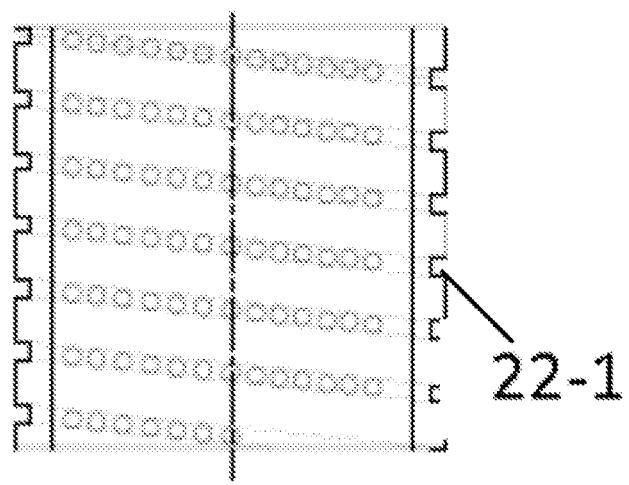
FIG. 7 is a partial enlarged view of the structure of the heating furnace pipe.
Figure 8:
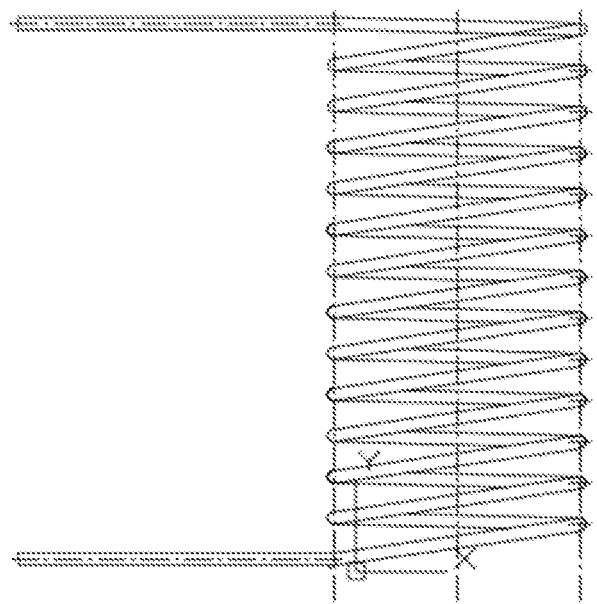
FIG. 8 is a schematic view of the structure of the heating element.

As shown in FIG. 5 and FIG. 6, the crucible support base 21 is placed at the bottom of the lower cavity insulating layer 14 of the lower furnace, and the bottom is fixed at the mounting base 23. The heating cavity is placed on the crucible support base 21, the crucible support base 21 is placed on the bottom of the supergravity test chamber. The crucible support base 21 is used to support the weight of the entire furnace and the compressive stress generated under the action of supergravity, while serving the function of thermal insulation, so as to prevent heat from being conducted to the bottom of the supergravity test device through thermal conduction under the action of supergravity. The heating cavity includes the upper heating cavity outer body 17, the lower heating cavity outer body 18, the upper heating furnace pipe 19 and the lower heating furnace pipe 20. The upper heating cavity outer body 17 and lower heating cavity outer body 18 are both sleeve structures. The upper heating cavity outer body 17 and the lower heating cavity outer body 18 are respectively and coaxially fixed for abutment in the upper and lower directions. The bottom of the lower heating cavity outer body 18 is fixed on the edge of the crucible support base 21. The upper heating furnace pipe 19 and the lower heating furnace pipe 20 are respectively sleeved in the upper heating cavity outer body 17 and the lower heating cavity outer body 18. The upper heating cavity outer body 17 and the lower heating cavity outer body 18 are filled with mullite insulating layer 16 between the upper cavity insulating layer 4 of the upper furnace, the middle cavity insulating layer 9 of the middle furnace, and the lower cavity insulating layer 14 of the lower furnace. As shown in FIG. 7, the outer walls of the upper heating furnace pipe 19 and the lower heating furnace pipe 20 are processed with the spiral groove 22-1. The spiral groove 22-1 is provided with a spiral heating element 22, as shown in FIG. 8. The spiral groove 22-1 can effectively fix heating element to prevent it from sliding under the action of supergravity. The heat generated by the heating element 22 is uniformly radiated to the heating furnace pipe composed of the upper heating furnace pipe 19 and the lower heating furnace pipe 20, and a high temperature zone is formed in the center of the heating furnace pipe composed of the upper heating furnace pipe 19 and the lower heating furnace pipe 20.

The upper heating cavity outer body 17 is used to arrange the heating furnace pipe 19, and the upper heating cavity outer body 17 and the upper heating furnace pipe 19 are used to heat the upper part of the device. The lower heating cavity outer body 18 is used to arrange the lower heating furnace pipe 20, and the lower heating cavity outer body 18 and the lower heating furnace pipe 20 are used to heat the lower part of the device.

The upper and lower annular end surfaces of the upper heating cavity outer body 17 and the lower heating cavity outer body 18 are provided with a plurality of through holes for connecting the upper insulating cover 1 along the circumference. The shaft connector/rod connector passes through the upper insulating cover 1 and is fitted into the through holes of the upper heating cavity outer body 17 and the lower heating cavity outer body 18 in the same axial direction.

The structural design of the heating furnace pipe and the heating element 22 of the disclosure can prevent the heating element 22 from falling off in a supergravity environment, and can also adjust the heating effect by adjusting the interval of the spiral groove at different positions.

During the operation process, the heating element 22 generates heat. The upper heating furnace pipe 19 and the lower heating furnace pipe 20 are heated through radiation to form a high temperature zone in the center of the heating furnace pipe. By changing the intervals of spiral grooves 22-1 at different heights, the intervals of heating elements 22 at different heights in the heating furnace are changed. With the temperature and flow rate of the cooling air introduced through the vent pipe channel 21-1 at the crucible support base 21, the bottom of the crucible starts to be cooled, forming a temperature gradient along the direction of supergravity.

The upper heating furnace pipe 19 and the lower heating furnace pipe 20 are made of ceramics with high strength and low thermal conductivity.

The specific implementation of the disclosure also requires the selection of the heating element 22, the spiral groove interval processed by the high-strength furnace pipe 17, and the material type of the high-strength furnace pipe 17.

Selection of heating element 22: The maximum temperature allowed for different heating elements 22 is different and the requirement for applicable environment is also different. The type of heating element 22 needs to be determined based on the specific use conditions of the device, the maximum operation temperature, the vacuum environment and the supergravity environment, such as iron-chromium-aluminum heating alloy wire and platinum wire.

The spiral groove interval processed by the upper heating furnace pipe 19 and the lower heating furnace pipe 20: the heating element 22 is very likely to be pulled up and deformed under the condition of supergravity, or even break. In addition to the layout design of the heating element 22, a series of changes brought about by the heating element 22 must also be considered, such as preventing the heating element 22 from breaking when the deformation and movement are severe under the condition of supergravity, thereby affecting the overall operation of the equipment.

Material type of upper heating furnace pipe 19 and lower heating furnace pipe 20: The material type of the upper heating furnace pipe 19 and the lower heating furnace pipe 20 is determined according to the type of the heating element 22 and the temperature requirements. In order to prevent the deformation caused by the weight of the upper heating furnace pipe 19 and the lower heating furnace pipe 20 under supergravity, the furnace body of the high temperature heating device is designed as a three-layer split type, and each layer is individually reinforced with an insulating layer.

Figure 9:
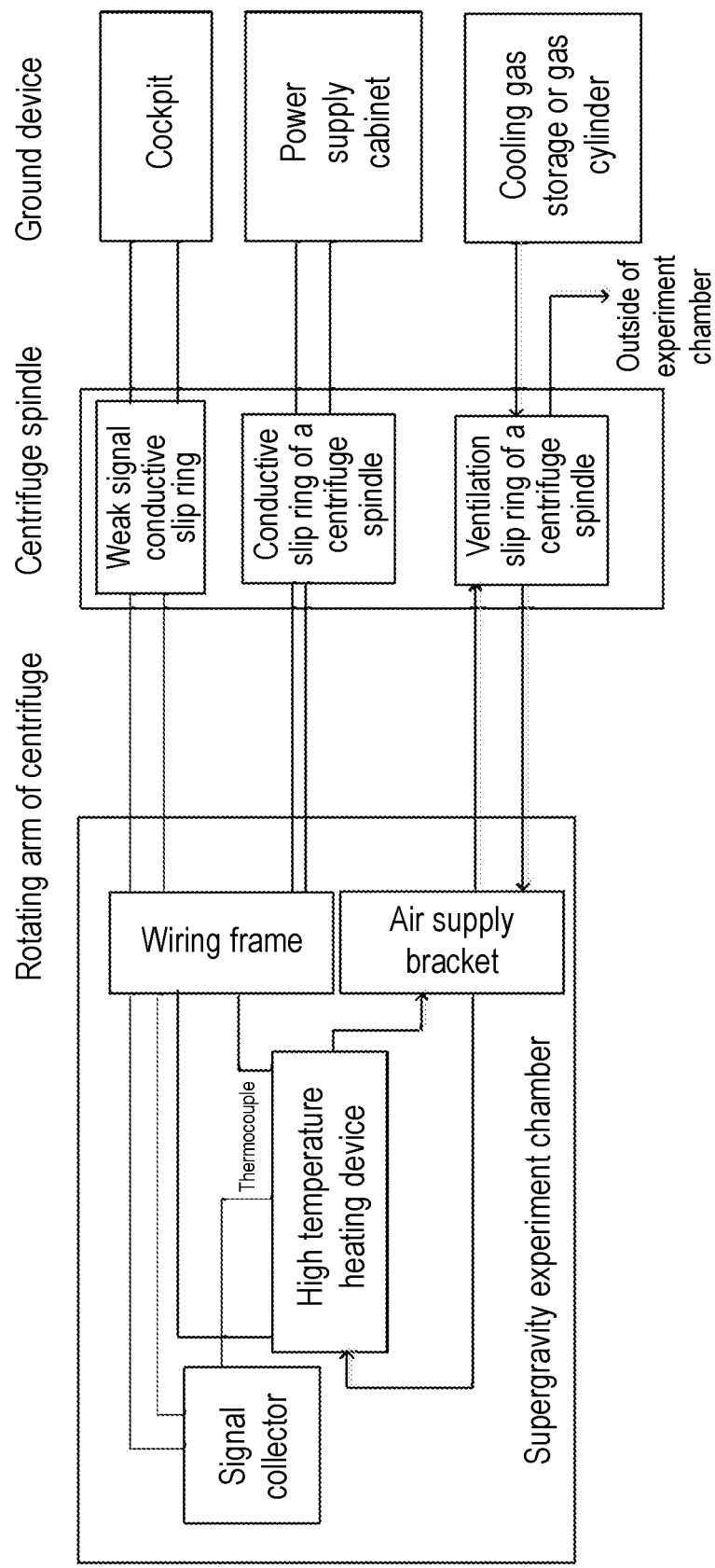
FIG. 9 is a schematic view of the electrical connection structure of the directional solidification melting system.

As shown in FIG. 9, the supergravity test chamber is also provided with a bearing frame, a signal collector and a wiring frame. The upper heating furnace pipe 19 and the lower heating furnace pipe 20 of the high-temperature heating subsystem are equipped with material samples to be directionally solidified, and provided with a temperature sensor. The temperature sensor is connected to the signal collector, the wire output by the signal collector is connected to the weak signal conductive slip ring through the wiring frame, and then connected to the ground measurement and control center.

The high-temperature heating subsystem is provided with a one-way strong current independent circuit. The one-way strong current independent circuit controls to heat the heating elements 22 at different heights inside for high temperature heating. A strong current independent circuit on the ground is connected to the wiring frame of the supergravity test chamber through the conductive slip ring of the centrifuge spindle.

The high-temperature heating subsystem is provided with an one-way cooling air circuit. The one-way cooling air independent circuit controls the incoming cooling air flow, and a cooling air independent circuit on the ground is connected to the cooling air pipeline bracket and exhaust pipe of the supergravity test chamber through the conductive slip ring of the centrifuge spindle.

In the specific implementation, an independent temperature control temperature extension wire that controls the high-temperature heating device is connected to the signal collector. The signal collector converts the received temperature signal from an analog signal to a digital signal; the digital signal is connected to the signal slip ring through the wiring frame, and then connected to the ground measurement and control center.

The furnace temperature is controlled by a temperature sensor fixed or welded on the sample to be tested through a temperature controller and a measurement and control system.

When the device of the disclosure is arranged for use, the lower cavity lower fixing cover 15 is first fixed to the bottom of the supergravity test device through bolts. The crucible support base 21 is arranged on the lower cavity lower fixing cover 15. The lower cavity outer housing 12, the lower cavity middle housing 13, and the lower cavity insulating layer 14 are connected to the lower cavity lower fixing cover 15 through bolts. The lower insulating cover 11 is connected with the middle cavity lower fixing cover 10 through bolts. The middle cavity middle housing 8, the middle cavity insulating layer 9, and the middle cavity lower fixing cover 10 are connected with the middle cavity lower fixing cover 10 through bolts, and then connected to the upper cavity lower fixing cover 5 and the middle insulating cover 6 through bolts.

The mullite insulating layer 16 is directly placed between the ceramic heating furnace pipes 19 and 20 as well as the lower cavity insulating layer 14, the middle cavity insulating layer 9, and the upper cavity insulating layer 4. The mullite insulating layer 16 not only can serve the function of buffering but also insulate heat.

The high-temperature heating subsystem can be reused. The only thing required is to replace the appropriate heating element 2 and heating furnace pipes 19 and 20 to meet different experimental requirements. It has the advantages of simple structure and high safety coefficient.

Figure 10:
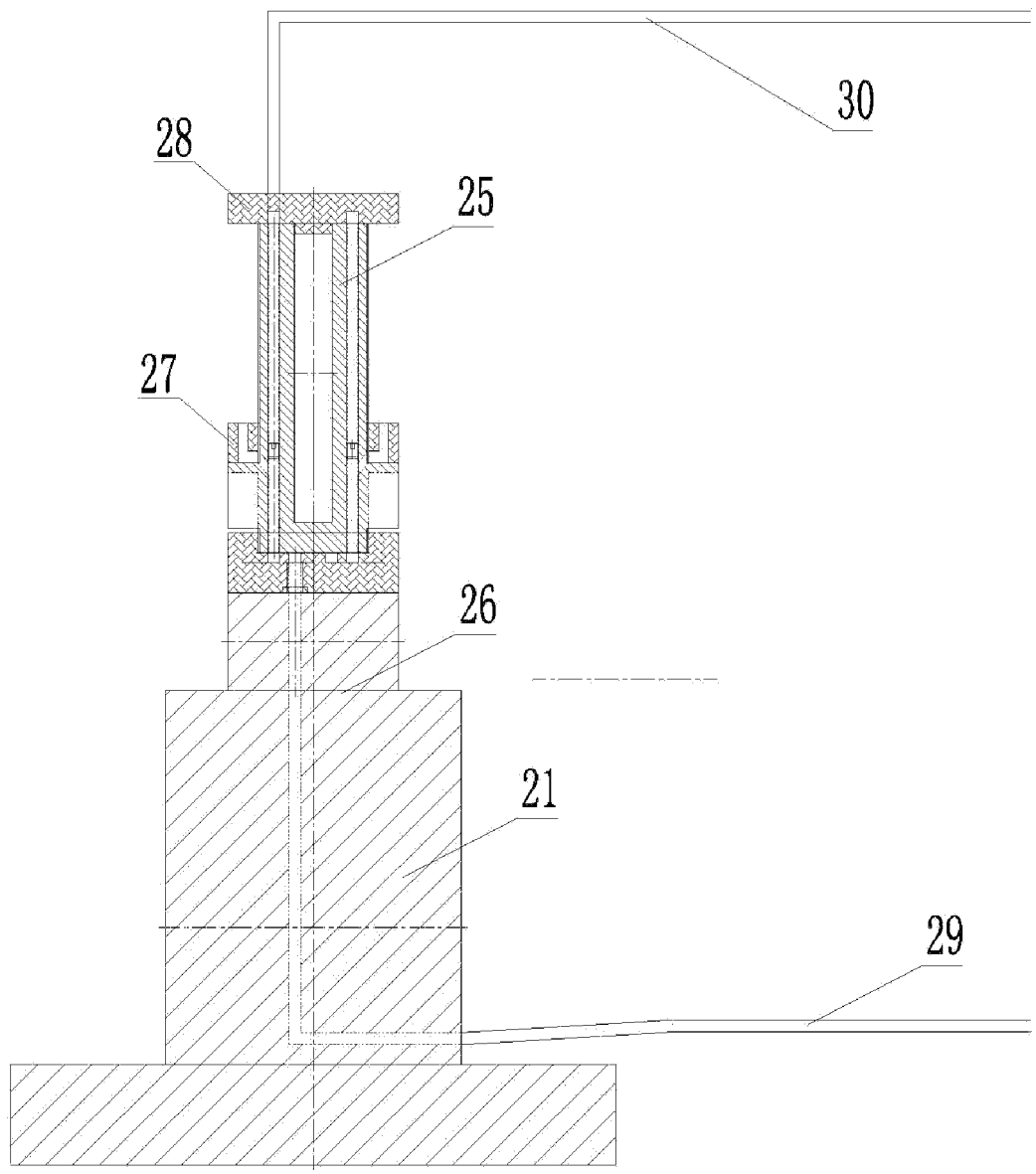
FIG. 10 is a general view of crucible and an air-cooling system.

As shown in FIG. 10, the crucible and air-cooling system are placed inside the upper heating furnace pipe 19 and the lower heating furnace pipe 20 on the crucible support base 21. There are gaps between the inner walls of the upper heating furnace pipe 19 and the lower heating furnace pipe 20 as well as the crucible and air-cooling system. The crucible and the air-cooling system include the air inlet pipe 29, the cooling base 26, the cooling rate adjustment ring 27, the crucible 25, the exhaust cover 28 and the exhaust pipe 30. The cooling base 26 is arranged on the top of the crucible support base 21. The crucible 25 is arranged on the cooling base 26. The exhaust cover 28 is arranged on top of the crucible 25. The middle of the crucible 25 is sleeved with the cooling rate adjustment ring 27. The air inlet pipe, the cooling base, the cooling rate adjustment ring, the crucible, the exhaust cover and the exhaust pipe provide a temperature gradient control system required for directional solidification for the directional solidification device.

Figure 11:
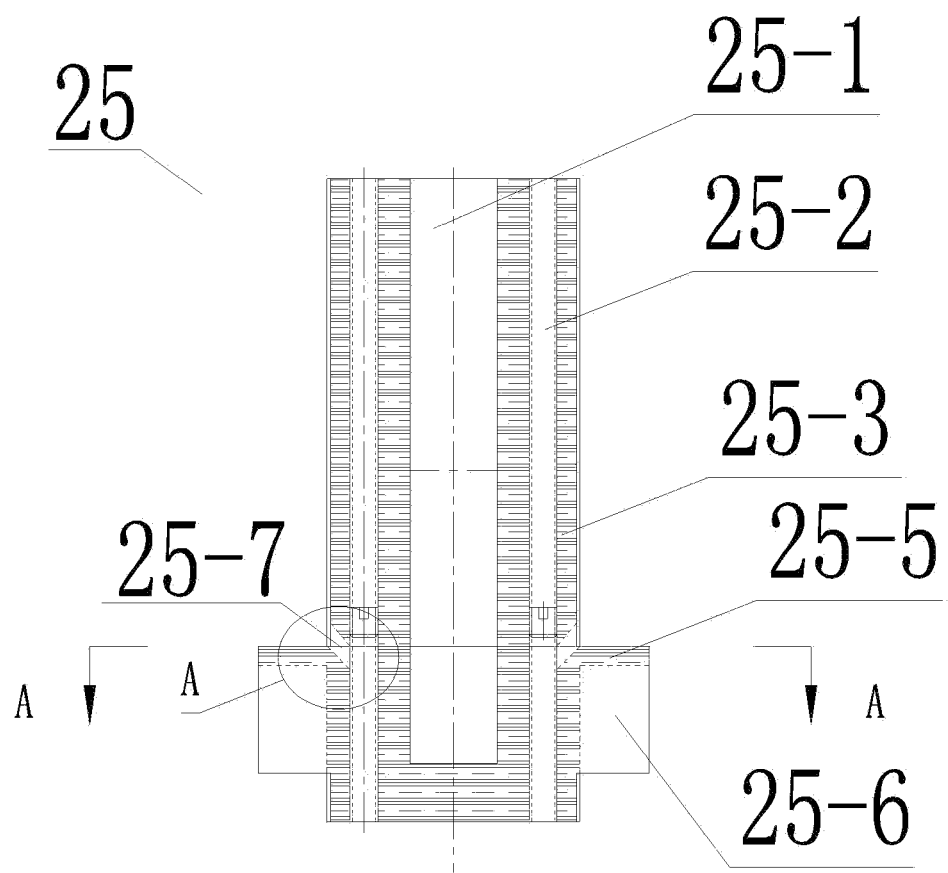
FIG. 11 is a front cross-sectional view of the crucible.

As shown in FIG. 11, a center cavity 25-1, a cooling hole 25-2, a temperature gradient adjustment block 25-3, a heat radiation groove 25-4, a positioning flange block 25-5, a heat-dissipating groove 25-6, and an air discharge hole 25-7 are arranged on the crucible 25. The main body of the crucible 25 is a columnar structure, and the center of the top surface of the crucible 25 is provided with a cylindrical blind hole as the center cavity 25-1. The center cavity 25-1 is filled with the metal melt/metal sample to be solidified by supergravity directional solidification. The top surface of the crucible 25 around the center cavity 25-1 is provided with multiple vertical through holes as cooling holes 25-2 along the circumference. The multiple cooling holes 25-2 are evenly spaced along the circumferential direction. Cooling air passes through the lower end of the cooling hole 25-2. Each cooling hole 25-2 is provided with a temperature gradient adjustment block 25-3 for realizing and adjusting the temperature gradient for directional solidification. There is a gap between the temperature gradient adjustment block 25-3 and the wall of the cooling hole 25-2. The temperature gradient adjustment block 25-3 can move up and down in the axial direction in the cooling hole 25-2. In specific implementation, the cooling hole 25-2 is connected to the upper outlet of the vent pipe channel 21-1 of the crucible support base 21, and cooling air is introduced into the cooling hole 25-2 through the vent pipe channel 21-1. The cooling hole 25-2 is the channel through which the cooling air diffuses on the crucible wall, which mainly uses the cooling air to take away heat to achieve the purpose of cooling the crucible.

As shown in FIG. 11 and FIG. 15, the lower peripheral surface of crucible 25 is fixed with annular bumps as positioning flange block 25-5. The positioning flange block 25-5 and the body of crucible 25 are integrally formed. The outer peripheral cylindrical surface of the lower part of the positioning flange block 25-5 is provided with multiple heat-dissipating groove 25-6. In specific implementation, the number of heat-dissipating groove 25-6 is twice that of the cooling hole 25-2. The heat-dissipating groove 25-6 extends radially outward from the inner wall of the body of crucible 25 to the outer wall of the positioning flange block 25-5, and penetrates the outer wall of the positioning flange block 25-5. The bottom of heat-dissipating groove 25-6 penetrates the bottom surface of the positioning flange block 25-5. The heat-dissipating groove 25-6 forms a cavity at the lower end of the positioning flange block 25-5 of the crucible 25, so as to enhance the heat dissipation effect at the lower part of crucible 25, which facilitates the formation of temperature gradient during solidification process of the crucible. In the meantime, a cavity is formed at the lower end of crucible 33 through the positioning flange block 25-5 and the heat-dissipating groove 25-6 thereon, which enhances the heat dissipation effect of the lower part of crucible 25 and facilitates the formation of temperature gradients during the solidification process of crucible 25. The positioning flange block 25-5, in addition to opening the heat-dissipating groove 25-6, assists in determining the position when the crucible 25 is arranged in the high-temperature heating subsystem, and prevents the crucible 25 from shaking under supergravity.

As shown in FIG. 11 and FIG. 13, a plurality of heat radiation grooves 25-4 are formed on the outer peripheral cylindrical surface of the crucible 25 above the positioning flange block 25-5. The plurality of heat radiation grooves 25-4 are evenly spaced along the circumferential direction. In the specific implementation, the number of the heat radiation groove 25-4 is the same as the number of the cooling hole 25-2. There is a heat radiation groove 25-4 on the outer peripheral cylindrical surface of the crucible 25 between two adjacent cooling holes 25-2. The heat radiation groove 25-4 axially penetrates the top surface of the crucible 25. The radial outer part of the heat-dissipating groove 25-6 penetrates the outer peripheral surface of crucible 25. In specific implementation, the heat radiation groove 25-4 operates with the upper heating furnace pipe 19, the lower heating furnace pipe 20 and the heating element 22 in the high-temperature heating subsystem of the high-gravity directional solidification melting furnace to heat the crucible.

As shown in FIG. 11, FIG. 12 and FIG. 14, on both sides of the side wall of the crucible 25 at the top surface of the positioning flange block 25-5, through holes are symmetrically opened as air discharge hole 25-7. The air discharge hole 25-7 connects the cooling hole 25-2 with the outside of the crucible 25. The air discharge hole 25-7 and cooling hole 25-2 form a cooling air passage for discharging cooling air, while preventing the crucible 25 from being damaged by the expansion of cooling air at high temperature.

Figure 16:
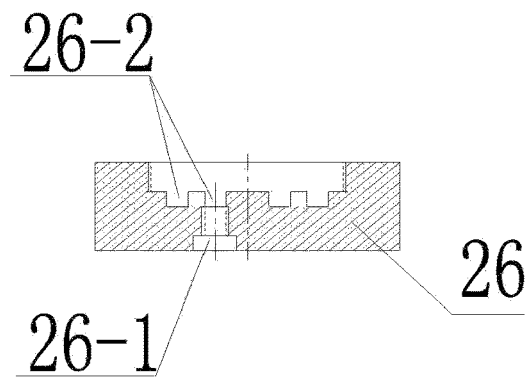
FIG. 16 is a cross-sectional view of the cooling base.

As shown in FIG. 16, the cooling base 26 is used to connect the crucible and the crucible support base. The upper end of the cooling base 26 is opened, and the lower annular groove 26-2 is provided in the opening. The circumferential size of the lower annular groove 26-2 is consistent with the circumferential size of the cooling hole 25-2 of the crucible 25. The lower end of the crucible 25 is provided in the upper opening of the cooling base 26. The lower ends of the various cooling holes 25-2 of the crucible 25 are connected through the lower annular groove 26-2. The bottom end of the cooling base 26 is opened with an air inlet through hole 26-1 that communicates with the lower annular groove 26-2. In specific implementation, the upper opening of the cooling base 26 is provided with two inner and outer lower annular grooves 26-2. The two lower annular grooves 26-2 are connected and communicated. A lower annular groove 26-2 at the outer circle and the circumference of the cooling hole 25-2 of the crucible 25 are correspondingly connected with each other, and a lower annular groove 26-2 at the inner circle is opened with an air inlet through hole 26-1.

Figure 17:
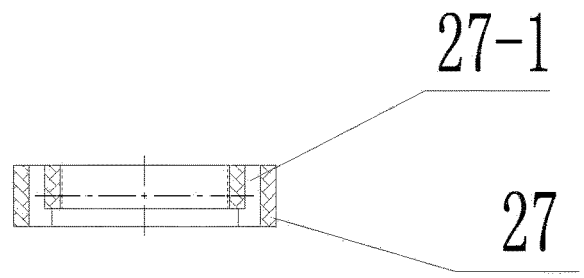
FIG. 17 is a cross-sectional view of the cooling rate adjustment ring.

As shown in FIG. 17, the cooling rate adjustment ring 27 is fixedly arranged on the positioning flange block 25-5 of the crucible 25. The bottom surface of the cooling rate adjustment ring 27 is in close contact with the top surface of the positioning flange block 25-5, and is supported by the top surface of the positioning flange block 25-5. There are one or two vertical air collecting slots 27-1 on the top surface of the rate adjustment ring 27. The number of the air collecting slots 27-1 is the same as the number of air discharge holes 25-7 of crucible 25. The top of the air collecting slot 27-1 passes through the cooling rate adjustment ring 27 and communicates with the outside of the crucible 25. The bottom end of the air collecting slot 27-1 passes through the wall surface at the inner circle of the cooling rate adjustment ring 27 and connects to the air discharge hole 25-7 of the crucible 25, thereby collecting the air after cooling the crucible.

Figure 18:
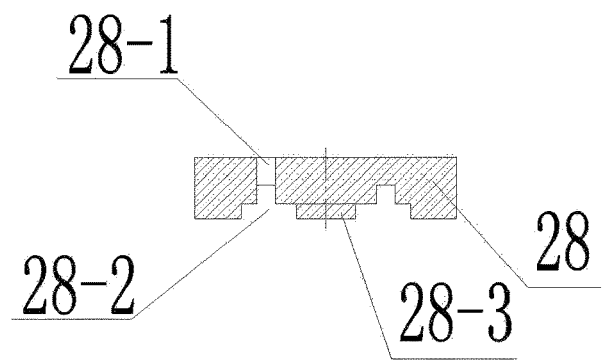
FIG. 18 is a cross-sectional view of the exhaust cover.

As shown in FIG. 18, the exhaust cover 28 is located at the uppermost part in the upper heating furnace pipe 19 and the lower heating furnace pipe 20. The lower end of the exhaust cover 28 is opened, and the upper annular groove 28-2 is provided in the opening. The circumferential size of the upper annular groove 28-2 is also consistent with the circumferential size of the cooling hole 25-2 of the crucible 25. The lower end of the crucible 25 is arranged in the opening at the lower end of the exhaust cover 28. The upper ends of the various cooling holes 25-2 of the crucible 25 are connected through the upper annular groove 28-2 to provide an air path for the cooling air. The air outlet through hole 28-1 communicating with the upper annular groove 28-2 is opened at the bottom end of the exhaust cover 28. The air outlet through hole 28-1 of the exhaust cover 28 communicates with one end of the exhaust pipe 30 for discharging the cooling air; the other end of the exhaust pipe 30 communicates with the outside to discharge the cooling air through the ventilation bracket inside the supergravity test chamber and the supergravity centrifuge slip ring. In specific implementation, the middle in the lower opening of the exhaust cover 28 is provided with the boss 28-3. The boss 28-3 is embedded at the top of the center cavity 25-1 of the crucible 25, thereby fixing the crucible to prevent the crucible from shaking under the action of supergravity.

As shown in FIG. 6 and FIG. 10, the function of crucible support base 21 is to provide support against the pressure generated by crucible and high-temperature heating subsystem under supergravity. The crucible support base 21 is provided with a vent pipe channel 21-1 therein, which is used for introducing the cooling air for directional solidification. The upper end of the vent pipe channel 21-1 penetrates the top surface of the crucible support base 21 to serve as an outlet and is connected to the air inlet through hole 26-1 of the cooling base 26. The lower end of the vent pipe channel 21-1 penetrates through the outer wall of the bottom of the crucible support base 21 and serves as an inlet, which is connected to one end of the air inlet pipe 29, and the other end of the air inlet pipe 29 is connected to a cooling air source outside the supergravity test chamber through the ventilation bracket inside the supergravity test chamber, thereby providing cooling air for the cooling system.

As shown in FIG. 10, the cooling air for the directional solidification test enters through the inlet at the lower end of the vent pipe channel 21-1, and is introduced into the bottom of the crucible 25 through the outlet at the upper end of the vent pipe channel 21-1. The cooling air cools the bottom of the crucible 25, thereby forming a temperature gradient along the direction of supergravity for directional solidification. Moreover, by regulating the flow of introduced cooling air and the temperature generated by the heating element 22, the temperature gradient distribution along the direction of supergravity is regulated.

As shown in FIG. 1, the supergravity test chamber C is used for supergravity directional solidification test. Two second mounting holes C7-3 are provided. Each second mounting hole C7-3 is provided with a cooling air valve device. One cooling air valve device is used as an air supply device, and the other cooling air valve device is used as an exhaust device. The cooling air is introduced into the air pipe fixing screw hole C92-2 of the air supply device through the air supply slip ring/air supply pipe through the air source outside the supergravity test chamber. Then, the cooling air enters the lower inlet of the internal vent pipe channel 21-1 inside the supergravity test chamber C through the air pipe connection screw hole C92-3 of the air supply device, so as to cool the temperature or supply air for the cooling device. The cooling air discharged from the upper outlet of the vent pipe channel 21-1 inside the supergravity test chamber C passes through the air pipe to enter the air pipe connecting screw hole C92-3 of the exhaust device, and then is discharged from the exhaust slip ring/exhaust pipe that is outside the supergravity test chamber C and communicates with the air pipe fixing screw hole C92-2 of the exhaust device.

The crucible 25 is used to hold metal melt/metal sample in the directional solidification process under supergravity.

The crucible 25 adopts high-strength ceramic materials to make the crucible have sufficient strength and rigidity, so as to ensure that it can operate normally under supergravity after being arranged in the directional melting furnace.

The crucible material has extremely low porosity to ensure that the high-temperature melt cannot seep out of the crucible under supergravity during the directional solidification process, so that it can be conveniently and flexibly applied to various types of supergravity directional solidification melting furnaces.

The cooling air is liquid nitrogen, compressed air, etc. The temperature of the cooling air is not higher than 5° C., the pressure is not higher than 5 Mpa, and the pressure is controllable and adjustable. According to the requirement of temperature gradient, the type of cooling air can be changed.

The disclosure can be suitable for supergravity environment of 1 g to 2500 g, and the temperature ranges from normal temperature to 1700° C.

Figure 20:
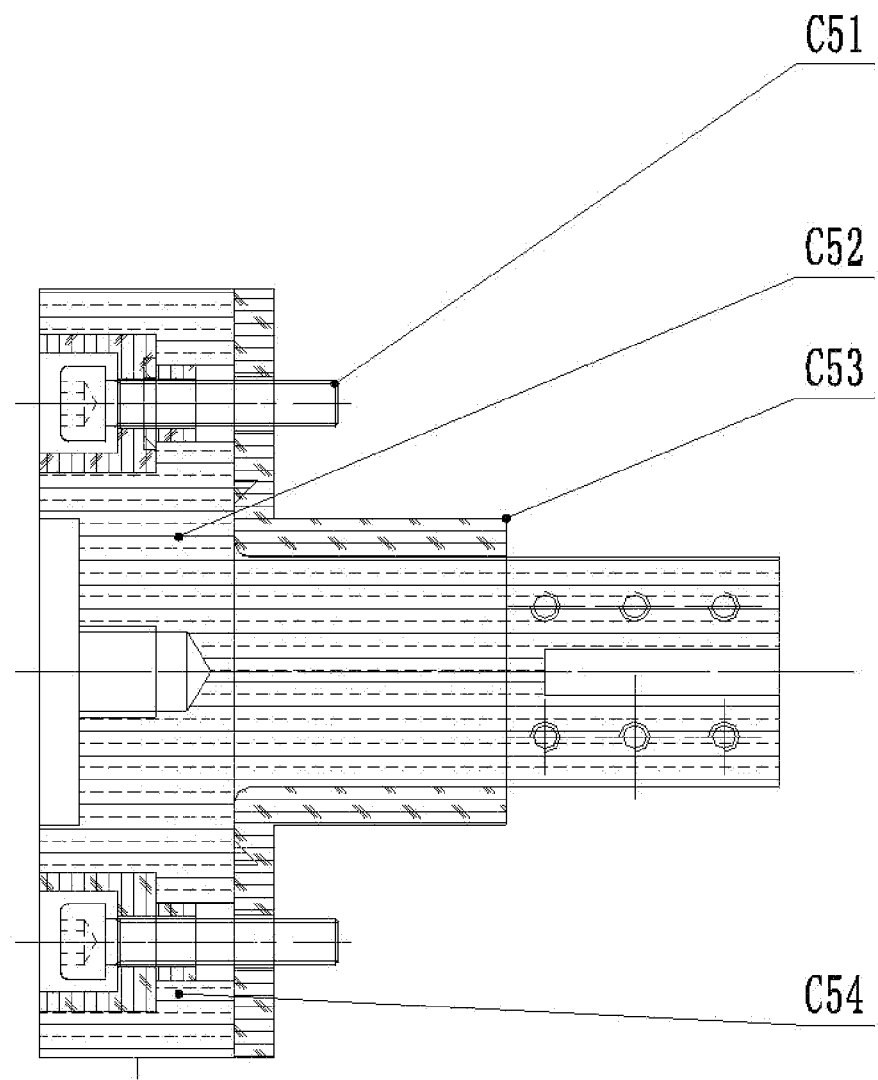
FIG. 20 is a main cross-sectional view of the wiring electrode.
Figure 21:
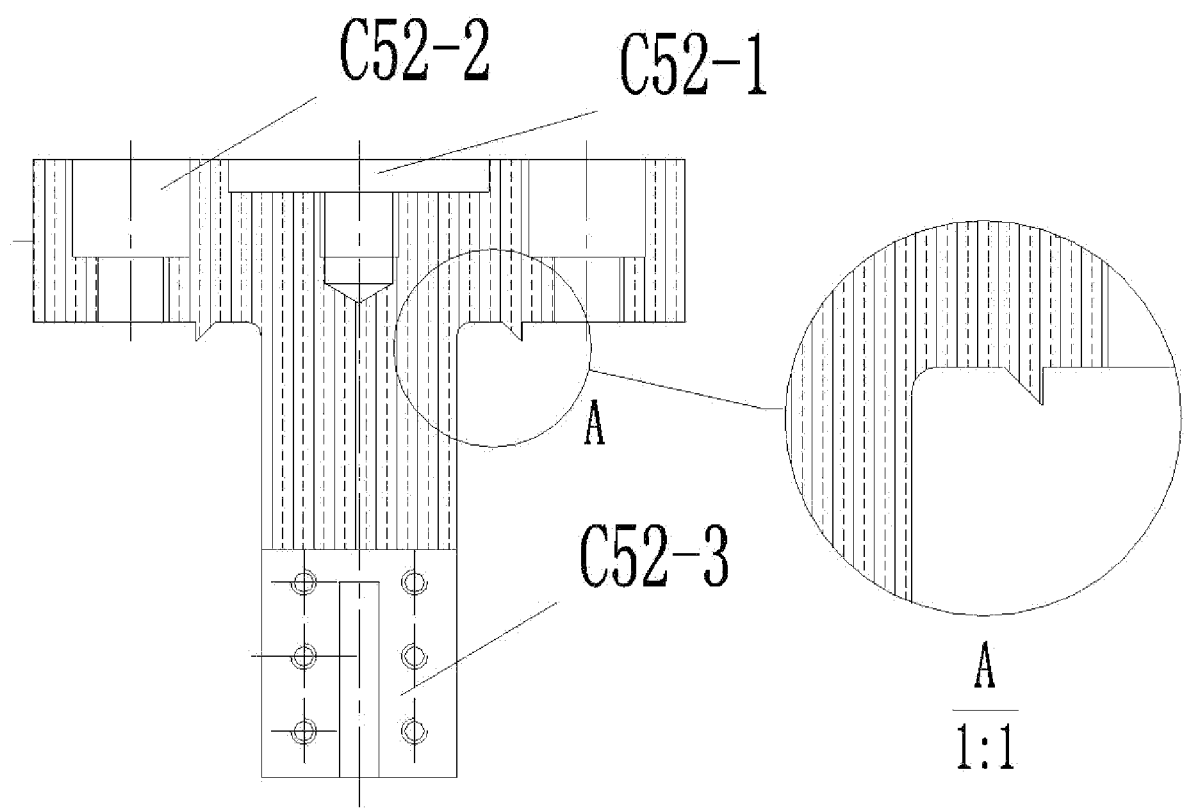
FIG. 21 is a cross-sectional view of the copper electrode of the wiring electrode and its partial enlargement view; inner hexagon screw C51, copper electrode C52, electrode insulating sleeve C53, electrode fixing insulating sleeve C54, fixing screw hole C52-1, connecting screw hole C52-2, wiring column C52-3, mounting screw hole C54-1.

As shown in FIG. 20 and FIG. 21, the wiring electrode C5 includes an inner hexagon screw C51, a copper electrode C52, an electrode insulating sleeve C53 and an electrode fixing insulating sleeve C54. The copper electrode C52 has a structure with large and small ends. The center of large end surface of the copper electrode C52 is provided with a connecting screw hole C52-1. The large end surface of the copper electrode C52 fixed around the screw hole C52-1 is opened with a connecting screw hole C52-2. The electrode insulating sleeve C53 is sleeved on the small end of the copper electrode C52 as well as the step between the small end and the large end. The inner hexagon screw C51 is connected to the electrode insulating sleeve C53 through the connecting screw hole C52-2, so that the copper electrode C52 is fixedly arranged in the electrode insulating sleeve C53 through inner hexagon screws C51. An electrode fixing insulating sleeve C54 is arranged between the inner hexagon screw C51 and the copper electrode C52. The end portion of the small end of the copper electrode C52 penetrates through the electrode insulating sleeve C53 and is connected to an external strong power supply. The copper electrode C52 is provided with a ring-shaped sharp protrusion at the step between the small end and the large end.

Figure 22:
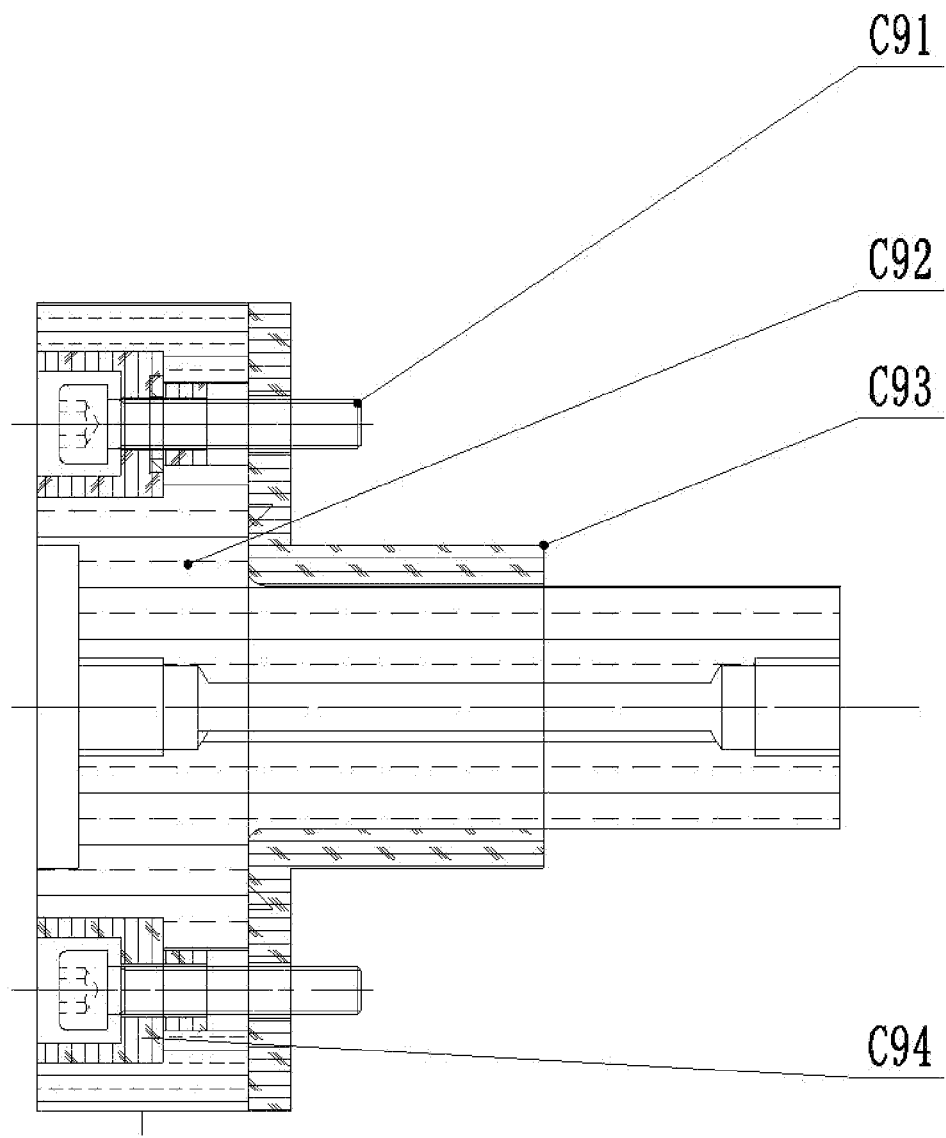
FIG. 22 is a front view of the cooling air valve device.
Figure 23:
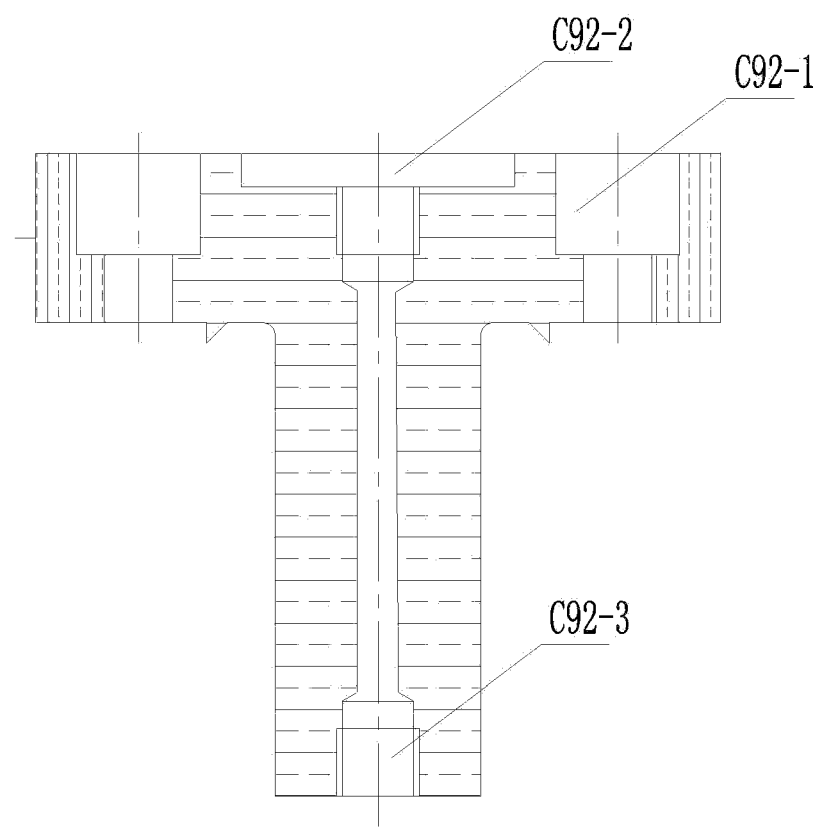
FIG. 23 is a cross-sectional view of the vent valve base of the cooling air valve device.

As shown in FIG. 22 and FIG. 23, the cooling air valve device C9 is provided in the supergravity test chamber and includes an inner hexagon screw C91, a vent valve base C92, a sealing sleeve C93 and a sealing member C94. The vent valve base C92 is a structure with a large end and a small end. The vent valve base C92 is arranged in the threaded mounting hole on the side wall of the supergravity test chamber. The large end of the vent valve base C92 is arranged outwards. The vent valve base C92 is mainly used for ventilation, and the maximum pressure is not higher than C5 Mpa; and it is made of copper. The center of the large end surface of the vent valve base C92 is provided with an air pipe fixing screw hole C92-2, which is connected with the air supply pipe or exhaust pipe outside the supergravity test chamber in a sealed manner. The large end surface of the vent valve base C92 around the air pipe fixing screw hole C92-2 is opened with the mounting screw hole C92-1. The sealing sleeve C93 is sleeved on the small end of the vent valve base C92 and on the step between the small end and the large end. The sealing sleeve C93 is provided with a connecting screw hole corresponding to the mounting screw hole C92-1. The inner hexagon screw C91 passes through the mounting screw hole C92-1 and the connecting screw hole and then is connected to the threaded mounting hole on the side wall of the supergravity test chamber. In this way, the vent valve base C92 and sealing sleeve C93 are arranged on the supergravity test chamber. A sealing member C94 is arranged between the inner hexagon screw C91 and the mounting screw hole C92-1 of the vent valve base C92. The sealing member C94 is used to isolate the inner hexagon screw C91 from the vent valve base C92. The small end of the vent valve base C92 penetrates the sealing sleeve C93 and extends into the supergravity test chamber. An air pipe connecting screw hole C92-3 is opened in the center of the small end surface of the vent valve base C92 inside the supergravity test chamber. The air pipe connecting screw hole C92-3 and the air pipe fixing screw hole C92-2 are communicated through the internal passage of the vent valve base C92. The air pipe connecting screw hole C92-3 is connected with the air pipe on the air supply bracket inside the supergravity test chamber in a sealed manner.

There are four mounting screw holes C92-1 provided, and the four mounting screw holes C92-1 are evenly arranged in the circumferential direction. The sealing sleeve C93 also has four mounting screw holes.

The vent valve base C92 is the same as the copper electrode C52, of which the large end is round, and the small end is square. The small end is square and fits with the square through hole on the side wall of the supergravity test chamber, so that the vent valve base C92 is restricted from rotating. The vent valve base C92 is the same as the copper electrode C52, for which a ring-shaped sharp protrusion is provided on the step between the small end and the large end. The sharp protrusion is closer to the middle position than the mounting screw hole C92-1. The sharp protrusion is used for positioning the vent valve base C92, and can also limit the radial/axial movement of the vent valve base C92 under the action of the centrifuge.

The vent valve base C92 of the disclosure is made of copper alloy, which has good shaping ability, and has good shaping ability under the condition of ensuring ventilation, and prevents the vent valve base from fatigue failure under the interaction of supergravity and cooling.

The sealing sleeve C93 isolates and seals the vent valve base C92 and the supergravity test chamber to prevent air leakage when the vent valve base C92 and the supergravity test chamber are fixed, and reduce the degree of vacuum in the test chamber. The sealing sleeve C93 is made of polytetrafluoroethylene, which has the effect of thermal insulation and prevents the temperature of the cooling air from decreasing.

The sealing member C94 isolates and seals the vent valve base C92 and the inner hexagon screw C91 to seal the gap between the inner hexagon screw C91 and the vent valve base C92, so as to prevent air leakage and reduce the degree of vacuum in the experimental chamber. The sealing member C94 can also be made of polytetrafluoroethylene, which has the effect of thermal insulation and prevents the temperature of the cooling air from dissipating through the inner hexagon screw C91.

The cooling air valve device is placed in a supergravity environment, especially for supergravity directional solidification tests. The supergravity direction is along the axial direction of the supergravity test chamber, and the vent valve base is arranged on the side wall of the supergravity test chamber, so the supergravity direction is along the radial direction of the vent valve base C92.

The wiring electrode C5 has four connecting screw holes C52-2, and the four connecting screw holes C52-2 are evenly arranged in the circumferential direction. The electrode fixing insulating sleeve C54 is correspondingly provided with four mounting screw holes.

The large end of the copper electrode C52 of the wiring electrode C5 is round and the small end is square. The small end surface of the copper electrode C52 is provided with a wiring column C52-3, and the wiring column C52-3 is connected to the wiring terminal of the strong power supply of the supergravity device.

A plurality of spaced fixing holes is opened on the surface of the lug part of the chamber lifting lug C3 protruding radially. The bolts pass through the fixing holes and are connected to the rotating arm of the supergravity centrifuge, so that the chamber lifting lug C3 is connected to the rotating arm of the supergravity centrifuge through the fixing hole and the bolt.

As shown in FIG. 1, the outer side wall of the chamber body C7 is provided with a vacuum interface C4, and the vacuum interface C4 is directly connected with the vacuum pipe outside the chamber body C7.

The cooling subsystem of the disclosure can meet the requirement that the maximum air supply pressure is not lower than C5 MPa in a supergravity environment, which facilitates to control the range of cooling rate of the heating or cooling device by adjusting the flow or pressure of cooling air, and can flexibly satisfy the requirement in temperature reduction for various types of supergravity airborne devices, thus having strong adaptability and a wide range of applications.

The directional solidification melting system is placed in the supergravity environment of the centrifuge. The supergravity test chamber is a test chamber for directional solidification of materials in a supergravity environment, which is placed in the hanging basket of the centrifuge.

Figure 24:
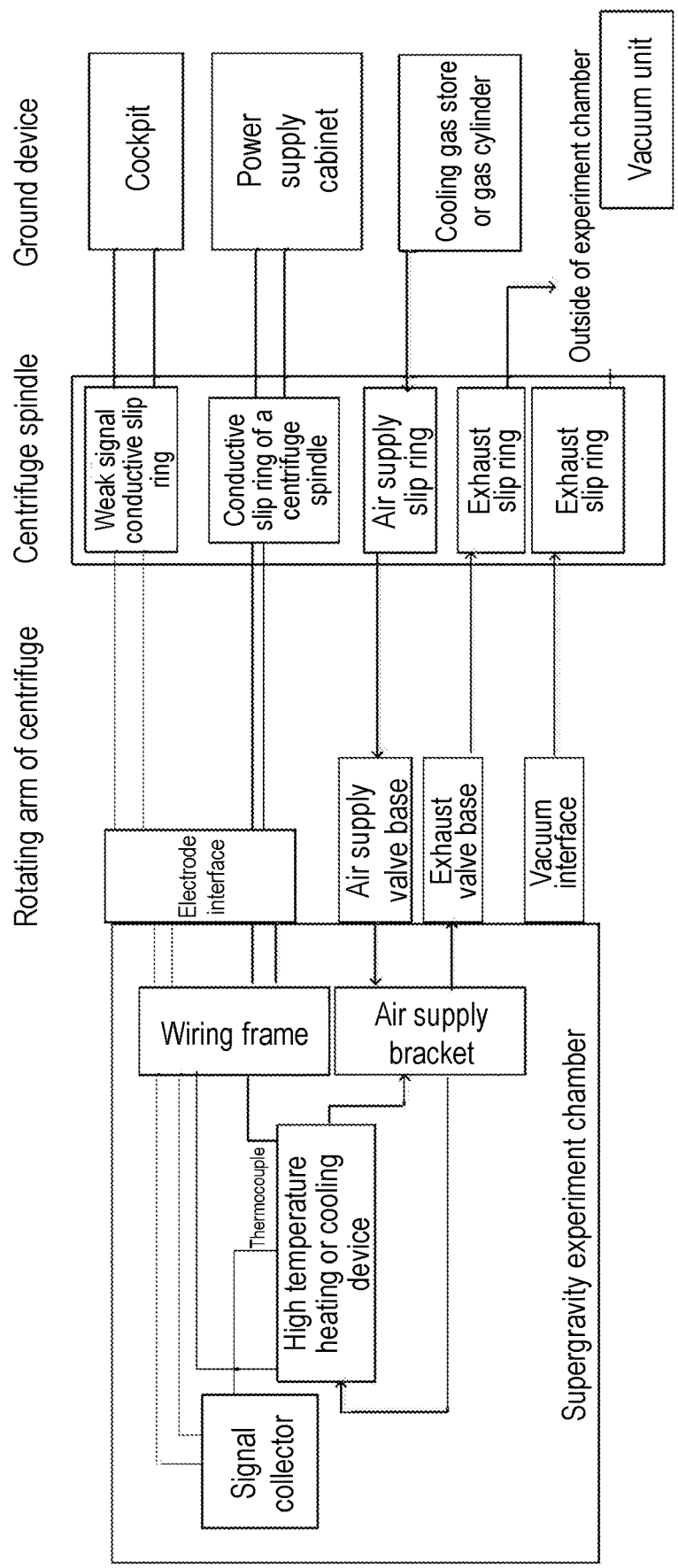
FIG. 24 is a schematic view of the connection and installation of the experimental chamber of the disclosure in the implementation of the supergravity directional solidification experiment.

The use and operation process of the melting furnace of the disclosure is as follows:

As shown in FIG. 24, during specific implementation of directional solidification process, the crucible 25 is arranged in a supergravity environment to operate under supergravity, and the supergravity is applied in the downward direction along the axial direction of the crucible 25. Specifically, the crucible 25 is arranged in the high-temperature heating subsystem of the supergravity directional solidification melting furnace.

Before the experiment, the temperature gradient, alloy melting temperature, centrifugal host speed and the quality of the temperature gradient adjustment block 25-3 are determined according to the type of casting alloy. The following describes the use and operation of the disclosure in detail.

Step 1: The directional melting system of the supergravity centrifugal device is arranged in the experiment chamber. The supergravity test chamber is placed in the hanging basket of the centrifuge. The high temperature heating device is placed in the supergravity test chamber, and the crucible arranged in the heating device is adopted to melt the sample. Through the connection of the electric slip ring on the main shaft, the air sealing slip ring is connected to the test host computer system on the ground and the cooling air source.

The wires of the temperature measuring thermocouple arranged around the crucible are connected to the signal collector. The signal collector will receive the temperature analog signal and convert the analog signal into a digital signal.

Step 2: The vacuum system is activated to make the degree of vacuum in the experimental chamber to reach $10^{-2}$ Pa.

Step 3: When the degree of vacuum in the experiment chamber reaches $10^{-2}$ Pa, the heating system is activated. A strong current independent circuit is respectively connected to the upper heating furnace pipe 19 and the lower heating furnace pipe 20 to form a high temperature zone in the heating zone.

The heating phase of the supergravity directional solidification test begins. Without cooling air, the heat generated by the heating element 22 is radiated and thermally conducted to the outer wall of crucible 25 through heat radiation groove 25-4, thereby heating the crucible 25 to heat the metal sample in the center cavity 25-1, and melt the sample in the crucible.

Step 4: When the temperature in the heating furnace pipes 19 and 20 reaches 0.8 times the melting point of the alloy, the centrifugal host is activated, and the centrifugal host is activated while heating.

Step 5: When the rotating speed of the centrifugal host reaches the experimental setting, heating is continued until the alloy is completely melted, and it is kept for 10 minutes at the designed rotating speed of the centrifugal host.

Step 6: The cooling system is started and the directional solidification begins to be performed.

In the solidification stage of the supergravity directional solidification test, the cooling air enters the vent pipe channel 21-1 inside the crucible support base 21 through the air inlet pipe 29, then enters the lower annular groove 26-2 through the air inlet through hole 26-1, and enters the various cooling holes 25-2 of the crucible 25, and enters the crucible 25 from the lower end of the cooling hole 25-2, and begin cooling the crucible 25. The initial temperature gradient adjustment block 25-3 is located at the bottom of the cooling hole 25-2. The pressure of the cooling air pushes the temperature gradient adjustment block 25-3 and flows through the gap between the temperature gradient adjustment block 25-3 and the wall of the cooling hole 25-2 to the top of the cooling hole 25-2, so that the center cavity 25-1 is cooled from bottom to top through the thermal conduction through the wall of the cooling hole 25-2.

For the control of the solidification stage, the temperature gradient adjustment block 25-3 is affected by the weight of the supergravity, the friction with the wall of the cooling hole 25-2 and the pressure of the cooling air during the movement of the cooling hole 25-2. There is a pressure difference between the two ends of the temperature gradient adjustment block 25-3 due to application of force. By setting the super weight of the temperature gradient adjustment block 25-3 under the action of supergravity, the friction force between the temperature gradient adjustment block 25-3 and the wall of the cooling hole 25-2 of the crucible 25 during the movement process, and the pressure of the cooling air, they can be combined according to needs to make the temperature gradient adjustment block 25-3 move up and down for adjustment under the action of the pressure difference, so as to realize the temperature gradient during the supergravity directional solidification process. In this way, the temperature of the center cavity 25-1 from bottom to top can be gradually reduced and cooled, so that the metal sample that has been melted in the center cavity 25-1 gradually solidifies as needed from bottom to top, and directional solidification is realized.

In the implementation, based on the precise calculation of the weight of the temperature gradient adjustment block 25-3 under the action of supergravity, the friction force between the temperature gradient adjustment block 25-3 and the crucible wall during the movement, according to the set temperature gradient, the pressure of the cooling air is accurately controlled. As such, in the directional solidification process, the temperature gradient adjustment block 25-3 is moved upward at a constant speed under the action of the pressure difference to control the position of the solidification interface, thereby forming a required temperature gradient along the liquid-solid interface before the solidification.

During the test, by changing the magnitude of the supergravity, the cooling air flow rate, the time, the weight of the temperature gradient adjustment block and other measures, along with the operation of the high-temperature heating subsystem of the supergravity directional melting furnace, different temperature gradient requirements can be satisfied. The bottom of the crucible is cooled by the cooling base, and the dispersed air is collected into the crucible cooling hole. The cooling speed adjustment ring collects the cooling air in the lower part of the crucible, and adjusts the position according to the requirements of temperature zone to achieve the requirements of different temperature zones.

After cooling and directional solidification, the cooling air that has passed through the cooling hole 25-2 of the crucible 25 enters the upper annular groove 28-2 from the top of the cooling hole 25-2, is collected in the upper annular groove 28-2, and then discharged by the exhaust pipe 30 through the air outlet through hole 28-1.

However, when the temperature gradient adjustment block 25-3 is blocked in the cooling hole 25-2, the pressure of the cooling air flows from the small diameter hole of the air discharge hole 25-7 and then flows to the outside of the crucible 25 through the air collecting slot 27-1 of the cooling rate adjustment ring 27. As such, it is possible to prevent the pressure of the cooling air from increasing continuously, avoiding safety problems caused by an infinite increase in internal pressure.

According to the flow rate, pressure and supergravity of the cooling air, the temperature distribution of the crucible along the supergravity direction can be changed by adjusting the height of the cooling rate adjustment ring 27 along the positioning flange block 25-5 of the crucible 25, so as to achieve precise control of the temperature gradient in the directional solidification according to the experimental requirements, and the internal cooling air of the crucible 25 with excessive pressure can be discharged to the outside.

During the experiment, the temperature signal is instantly transmitted to the signal collector. The signal collector converts the analog signal into a digital signal, which is then connected to the signal slip ring through the wiring frame, and finally connected to the ground measurement and control center to obtain the temperature-time curve during the experiment.

Step 7: When the sample is completely solidified, the heating system is turned off.

Step 8: When the temperature drops below the alloy solidus temperature, the centrifugal host is turned off.

Step 9: When the temperature drops below 200° C., the cooling system and vacuum system are turned off.

In this manner, the disclosure can independently control the heating temperature of the high-temperature heating device through the thermocouple, and the amount of cooling air passes into the bottom of the crucible with the vent pipe channel 21-1 to cool the bottom of the crucible, so as to form a temperature gradient along the direction of supergravity. The temperature gradient can be regulated by adjusting the flow rate and temperature.

What is claimed is:

1. A supergravity directional solidification melting furnace equipment, the supergravity directional solidification melting furnace equipment comprises a supergravity test chamber, and a heating subsystem, a crucible, and an air-cooling system mounted in the supergravity test chamber, the heating subsystem is fixed at a bottom of the supergravity test chamber, the crucible and the air-cooling system are provided in the heating subsystem;

the supergravity test chamber comprises a chamber interface member, an upper sealed dome, a chamber lifting lug and a chamber body; the chamber body has a cavity disposed therein, an upper end of the cavity is open, two side walls of the chamber body are each connected outwardly with the chamber lifting lug, and the chamber lifting lug on both sides is hingedly connected to a swing arm of a hanging basket of a supergravity centrifuge, the upper sealed dome is connected to a cavity opening end surface of the chamber body through a bolt to achieve sealed connection; a center of the upper sealed dome is provided with the chamber interface member, and the chamber interface member comprises a communication upper sealed hatch cover and a communication chamber body, the communication upper sealed hatch cover is provided at an upper opening of the communication chamber body, both the communication upper sealed hatch cover and the communication chamber body are provided with an outer flange, a first screw hole is opened on a step surface of the outer flange, the bolt passes through the first screw hole to connect to the upper sealed dome; the chamber interface member is further provided with an upper glass press-fitting flange, an upper flange fastening screw, a quartz glass and a vacuum socket, the quartz glass is fixedly arranged at an opening in a center of a top of the communication upper sealed hatch cover through the upper glass press-fitting flange, the upper glass press-fitting flange is fixed to the top of the communication upper sealed hatch cover through the upper flange fastening screw, the communication upper sealed hatch cover, a bottom of the communication chamber body is opened with a hole, and the hole is provided with the vacuum socket; an inner bottom surface of the cavity of the chamber body is fixed with a wiring frame and an air supply bracket, one side wall of the chamber body is provided with a first wiring hole and a first mounting hole, the other side wall of the chamber body is provided with a second wiring hole and a second mounting hole symmetrically, the first wiring hole is provided with a wiring electrode, the wiring electrode is connected to the wiring frame inside the chamber body through the first wiring hole, and a weak signal control wire is connected to the wiring frame through the first mounting hole; a cooling air valve device is arranged in the second mounting hole, cooling air is connected to the cooling air valve device through a pipeline, the cooling air valve device enters and exits air ports for communication through the pipeline on the air supply bracket and a test instrument in the chamber body;

the heating subsystem comprises a mounting base and an upper furnace, a middle furnace, a lower furnace and a mullite insulating layer arranged on the mounting base and connected in sequence from top to bottom, an upper heating cavity outer body, a lower heating cavity outer body, an upper heating furnace pipe, a lower heating furnace pipe, a crucible support base, and a heating element; the crucible support base is provided at a bottom of a lower cavity insulating layer of the lower furnace, a bottom of the crucible support base is fixed at the mounting base, a heating cavity is arranged on the crucible support base, the heating cavity comprises the upper heating cavity outer body, the lower heating cavity outer body, the upper heating furnace pipe, and the lower heating furnace pipe, the upper heating cavity outer body and the lower heating cavity outer body are both sleeve structures, the upper heating cavity outer body and the lower heating cavity outer body are respectively and coaxially fixed for abutment, the upper heating furnace pipe and the lower heating furnace pipe are respectively sleeved in the upper heating cavity outer body and the lower heating cavity outer body, the upper heating cavity outer body and the lower heating cavity outer body are filled with the mullite insulating layer between an upper cavity insulating layer of the upper furnace, a middle cavity insulating layer of the middle furnace, and a lower cavity insulating layer of the lower furnace; a spiral groove is processed on outer walls of the upper heating furnace pipe and the lower heating furnace pipe, the spiral groove is provided with the heating element which is in a form of a spiral, heat generated by the heating element is evenly radiated to a heating furnace pipe composed of the upper heating furnace pipe and the lower heating furnace pipe;

the crucible and the air-cooling system are placed inside the upper heating furnace pipe and the lower heating furnace pipe on the crucible support base, the crucible and the air-cooling system comprise an air inlet pipe, a cooling base, a cooling rate adjustment ring, the crucible, an exhaust cover and an exhaust pipe; the cooling base is arranged on a top surface of the crucible support base, the crucible is arranged on the cooling base, the exhaust cover is arranged on a top of the crucible, and the cooling rate adjustment ring is arranged in a middle of the crucible; a center cavity, a cooling hole, a temperature gradient adjustment block, a heat radiation groove, a positioning flange block, a heat-dissipating groove, and an air discharge hole are arranged on the crucible, a main body of the crucible is a columnar structure, and a center of a top surface of the crucible is provided with a cylindrical blind hole as the center cavity, the center cavity is filled with metal melt/metal sample to be solidified by supergravity directional solidification; the top surface of the crucible around the center cavity is provided with multiple vertical through holes as cooling holes along the circumference; the cooling holes are evenly spaced along a circumferential direction, the cooling air passes through a lower end of the cooling hole; each of the cooling holes is provided with the temperature gradient adjustment block for realizing and adjusting the temperature gradient for directional solidification, there is a gap between the temperature gradient adjustment block and a wall of the cooling hole, the temperature gradient adjustment block is capable of moving up and down in an axial direction in the cooling hole; a ring-shaped bump serves as the positioning flange block is fixed at a lower circumferential surface of the crucible, an outer peripheral cylinder surface of a lower part of the positioning flange block is provided with multiple heat-dissipating grooves, the heat-dissipating grooves extend radially outward from an inner wall of the crucible body to an outer wall of the positioning flange block, an outer peripheral cylinder surface of the crucible above the positioning flange block is provided with the multiple heat radiation grooves, and the multiple heat radiation grooves are evenly spaced along the circumferential direction, the heat radiation grooves are provided at an outer peripheral cylinder surface of the crucible between two adjacent cooling holes, on both sides of the crucible side wall at a top surface of the positioning flange block, through holes are symmetrically opened as air discharge holes, which connect the cooling holes with an exterior of the crucible; the upper end of the cooling base has an opening, and there is a lower annular groove in the opening, a lower end of the crucible is arranged in an upper opening of the cooling base, and various cooling holes of the crucible are connected through the lower annular groove, a bottom end of the cooling base is provided with an air inlet through hole communicating with the lower annular groove; the cooling rate adjustment ring is fixedly arranged on the positioning flange block of the crucible, a top surface of the cooling rate adjustment ring is provided with one or two vertical air collecting grooves, and a bottom end of the air collecting groove passes through the inner wall of the cooling rate adjustment ring and communicates with the air discharge hole of the crucible, a lower end of the exhaust cover has an opening, and an upper annular groove is arranged in the opening, the lower end of the crucible is arranged in the opening at the lower end of the exhaust cover, and the upper end of each of the cooling holes of the crucible is connected through the upper annular groove, an air outlet through hole communicating with the upper annular groove is opened at a bottom end of the exhaust cover, the air outlet through hole of the exhaust cover communicates with one end of the exhaust pipe; the other end of the exhaust pipe communicates with the exterior of the crucible to discharge the cooling air; a middle of the opening at the lower end of the exhaust cover forms a boss, and the boss is embedded at the top of the center cavity of the crucible;

the crucible support base is provided with a vent pipe channel therein, which is used for introducing the cooling air for directional solidification, an upper end of the vent pipe channel penetrates the top surface of the crucible support base to serve as an outlet and is connected to the air inlet through hole of the cooling base, a lower end of the vent pipe channel penetrates through an outer wall of the bottom of the crucible support base and serves as an inlet, which is connected to one end of an air inlet pipe, and the other end of the air inlet pipe is connected to a cooling air source; the cooling air for directional solidification enters through the lower end of the vent pipe channel, and is introduced into a bottom of the crucible through an outlet at the upper end of the vent pipe channel, the cooling air cools the bottom of the crucible, thereby forming a temperature gradient along the direction of supergravity for directional solidification, by regulating a flow of introduced cooling air and a temperature of the heating element, the temperature gradient distribution along the direction of supergravity is regulated.

2. The supergravity directional solidification melting furnace equipment according to claim 1, wherein during an operation process, the heating element generates heat, the upper heating furnace pipe and the lower heating furnace pipe are heated through radiation, the spiral groove and the heating element are each provided in plural, by changing intervals of the spiral grooves at different heights, intervals of heating elements at different heights in the heating furnace are changed, with temperature and flow rate of the cooling air introduced through the vent pipe channel at the crucible support base, the bottom of the crucible starts to be cooled, forming the temperature gradient along the direction of supergravity.

3. The supergravity directional solidification melting furnace equipment according to claim 1, wherein the wiring electrode comprises an inner hexagon screw, a copper electrode, an electrode insulating sleeve and an electrode fixing insulating sleeve; the copper electrode has a structure with a large end and a small end, a center of a large end surface of the copper electrode is provided with a fixing screw hole, the large end surface of the copper electrode around the fixing screw hole is opened with a connecting screw hole; the electrode insulating sleeve is sleeved on the small end of the copper electrode as well as a step between the small end and the large end of the copper electrode, the inner hexagon screw is connected to the electrode insulating sleeve through the connecting screw hole, so that the copper electrode is fixedly arranged in the electrode insulating sleeve through inner hexagon screw, an electrode fixing insulating sleeve is arranged between the inner hexagon screw and the copper electrode, an end portion of the small end of the copper electrode penetrates through the electrode insulating sleeve and is configured to be connected to an external power supply, the copper electrode is provided with a ring-shaped protrusion at the step between the small end and the large end of the copper electrode.

4. The supergravity directional solidification melting furnace equipment according to claim 3, wherein the cooling air valve device is provided in the supergravity test chamber and comprises an inner hexagon screw, a vent valve base, a sealing sleeve and a sealing member; the vent valve base is a structure with a large end and a small end, a center of a large end surface of the vent valve base is provided with an air pipe fixing screw hole, which is connected with an air supply pipe or an exhaust pipe outside the supergravity test chamber in a sealed manner, the large end surface of the vent valve base around the air pipe fixing screw hole is opened with a mounting screw hole, the sealing sleeve is sleeved on the small end of the vent valve base and on a step between the small end and the large end of the vent valve base, the sealing sleeve is provided with a connecting screw hole corresponding to the mounting screw hole, the inner hexagon screw passes through the mounting screw hole and the connecting screw hole and then is connected to a threaded mounting hole on the side wall of the supergravity test chamber, in this way, the vent valve base and sealing sleeve are arranged on the supergravity test chamber, the sealing member is arranged between the inner hexagon screw and the mounting screw hole of the vent valve base; the small end of the vent valve base penetrates the sealing sleeve and extends into the supergravity test chamber, an air pipe connecting screw hole is opened in a center of a small end surface of the vent valve base inside the supergravity test chamber, the air pipe connecting screw hole and the air pipe fixing screw hole are communicated through an internal passage of the vent valve base, the air pipe connecting screw hole is connected with the air pipe on the air supply bracket inside the supergravity test chamber in a sealed manner.

5. The supergravity directional solidification melting furnace equipment according to claim 4, wherein the vent valve base is the same as the copper electrode, of which the large end is round, and the small end is square; the vent valve base is the same as the copper electrode, for which the ring-shaped protrusion is provided on the step between the small end and the large end of the vent valve base, the ring-shaped protrusion is used for positioning the vent valve base, and also limits a radial/axial movement of the vent valve base under operation of the centrifuge.

6. The supergravity directional solidification melting furnace equipment according to claim 1, wherein a large end of a copper electrode of the wiring electrode is round and a small end of the copper electrode is square; a small end surface of the copper electrode is provided with a wiring column, and the wiring column is configured to be connected to a wiring terminal of a power supply of a supergravity device.

7. The supergravity directional solidification melting furnace equipment according to claim 6, wherein the supergravity test chamber is used for supergravity directional solidification test, two second mounting holes are provided, each of the second mounting holes is provided with a cooling air valve device, one of the cooling air valve devices is used as an air supply device, and the other cooling air valve device is used as an exhaust device, the cooling air is introduced into an air pipe fixing screw hole of the air supply device through an air supply slip ring or an air supply pipe through an air source outside the supergravity test chamber, then, the cooling air enters a lower inlet of an internal vent pipe channel inside the supergravity test chamber through an air pipe connection screw hole of the air supply device, so as to cool the temperature or supply air for a cooling device; the cooling air discharged from an upper outlet of the vent pipe channel inside the supergravity test chamber passes through the air pipe to enter the air pipe connecting screw hole of the exhaust device, and then is discharged from an exhaust slip ring or an exhaust pipe that is outside the supergravity test chamber and communicates with the air pipe fixing screw hole of the exhaust device.

8. The supergravity directional solidification melting furnace equipment according to claim 1, wherein a plurality of spaced fixing holes is opened on a surface of a lug part of the chamber lifting lug protruding radially, bolts pass through the fixing holes and are connected to a rotating arm of the supergravity centrifuge, so that the chamber lifting lug is connected to the rotating arm of the supergravity centrifuge through the fixing holes and the bolt.

9. The supergravity directional solidification melting furnace equipment according to claim 1, wherein an outer side wall of the chamber body is provided with a vacuum interface, and the vacuum interface is directly connected with a vacuum pipe outside the chamber body.

10. The supergravity directional solidification melting furnace equipment according to claim 1, wherein the supergravity test chamber is further provided with a bearing frame, a signal collector and a wiring frame, the upper heating furnace pipe and the lower heating furnace pipe of the heating subsystem are equipped with material samples to be directionally solidified, and provided with a temperature sensor, the temperature sensor is connected to the signal collector, a wire output by the signal collector is connected to a weak signal conductive slip ring through the wiring frame, and then connected to a ground measurement and control center; the heating subsystem is provided with a one-way current independent circuit, the one-way current independent circuit controls to heat the heating elements at different heights inside for high temperature heating, a current independent circuit on the ground is connected to the wiring frame of the supergravity test chamber through a conductive slip ring of a centrifuge spindle; the heating subsystem is provided with an one-way cooling air independent circuit, the one-way cooling air independent circuit controls an incoming cooling air flow, and the one-way cooling air independent circuit on the ground is connected to a cooling air pipeline bracket and the exhaust pipe of the supergravity test chamber through the conductive slip ring of the centrifuge spindle.

* * * * *